United States Patent
Lee et al.

(10) Patent No.: US 7,372,336 B2
(45) Date of Patent: May 13, 2008

(54) SMALL-SIZED ON-CHIP CMOS POWER AMPLIFIER HAVING IMPROVED EFFICIENCY

(75) Inventors: Jae-Sup Lee, Yongin-si (KR); Hyun-Il Kang, Yongin-si (KR); Seong-Soo Lee, Suwon-si (KR); Holger Lothar, Ulwang-si (KR); Ju-Hyun Ko, Seongnam-si (KR); Dong-Hyun Baek, Suwon-si (KR); Song-Cheol Hong, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 175 days.

(21) Appl. No.: 11/323,744

(22) Filed: Dec. 30, 2005

(65) Prior Publication Data

US 2006/0170503 A1 Aug. 3, 2006

(30) Foreign Application Priority Data

Dec. 31, 2004 (KR) ............... 10-2004-0118337
Mar. 29, 2005 (KR) ............... 10-2005-0026142

(51) Int. Cl.
*H03F 3/14* (2006.01)
(52) U.S. Cl. .................. 330/307; 330/276
(58) Field of Classification Search ............. 330/66, 330/124 R, 276, 286, 295, 307
See application file for complete search history.

(56) References Cited

U.S. PATENT DOCUMENTS

| | | | |
|---|---|---|---|
| 5,781,071 A | 7/1998 | Kusunoki | 330/269 |
| 5,990,736 A | 11/1999 | Nasuno et al. | 330/66 |
| 6,359,513 B1 | 3/2002 | Kuo et al. | 330/276 |
| 6,737,948 B2 | 5/2004 | Aoki et al. | 336/200 |
| 7,119,619 B2 * | 10/2006 | Komijani et al. | 330/276 |
| 7,129,784 B2 * | 10/2006 | Bhatti et al. | 330/295 |
| 2003/0169113 A1 | 9/2003 | Komijani et al. | 330/276 |
| 2003/0184369 A1 | 10/2003 | Aoki et al. | 330/55 |

* cited by examiner

*Primary Examiner*—Khanh Van Nguyen
(74) *Attorney, Agent, or Firm*—The Farrell Law Firm, PC

(57) ABSTRACT

A small-sized on-chip complementary metal-oxide semiconductor (CMOS) Power Amplifier having improved efficiency is provided herein. The on-chip CMOS power amplifier is capable of improving efficiency and maximizing output thereof by enhancing a K factor, which may cause a problem in a power amplifier having a distributed active transformer structure. The on-chip CMOS power amplifier having an improved efficiency and being fabricated in a small size, the on-chip CMOS power amplifier includes a primary winding located at a first layer, secondary windings located at a second layer, which is an upper part of the first layer, the secondary windings being located corresponding to a position of the primary winding, and a cross section for coupling the second windings with each other.

14 Claims, 22 Drawing Sheets

SMALL-SIZED ON-CHIP CMOS POWER
AMPLIFIER HAVING IMPROVED
EFFICIENCY

PRIORITY

This application claims priority to applications entitled "Small-Sized On-Chip CMOS Power Amplifier Having Improved Efficiency" filed in the Korean Intellectual Property Office on Dec. 31, 2004 and Mar. 29, 2005 and assigned Serial No. 2004-118337 and 2005-26142, respectively, the contents of which are incorporated herein by reference.

BACKGROUND OF THE INVENTION

1. Field of the Invention

The present invention relates generally to a radio frequency (RF) system, and more particularly to the integration of a power amplifier section used for an RF system.

2. Description of the Related Art

Recently, the trend of a radio frequency (RF) system is being focused on "RF system on-chip". Accordingly, a monolithic microwave integrated circuit (MMIC) technique and a complementary metal oxide semiconductor (CMOS) technique are attracting attention. The MMIC technique enables that passive components such as resistors, inductors, and capacitors and active components such as transistors and field effect transistors (FETs) are manufactured on one semiconductor substrate through an integrated process and the CMOS technique enables that all logical circuits and all high-frequency RF analog circuits are realized on one chip at a low price. In particular, although the CMOS technique may be determined as an ultimate technique in which all logical circuits and all high-frequency RF analog circuits can be realized on one chip at a low price, the CMOS technique is not stabilized due to a noise characteristic in high frequencies exceeding 1 GHz and parasitic signals between parts of the CMOS. However, as an RF technique has developed, it is expected that most of circuits inside of a cellular terminal will be included in three or four chips according to a CMOS RF IC technique in a few years.

Although every effort for integration of an RF system is being continuously made so that the RF system can have a high efficiency and a high linear characteristic in a small size as described above, the integration of a power amplifier section raises a question in the RF system. More specifically, in the integration through the CMOS technique, CMOS on-chip is not achieved by using group III or IV compounds because power efficiency is reduced due to a low drain-gate, drain-source, or drain-substrate breakdown voltage of a CMOS and a low resistivity of a substrate. However, recently, power amplifiers have been developed that overcome the disadvantage of a CMOS. Hereinafter, circuits integrated using the CMOS will be described with reference to the accompanying drawings.

FIG. 1 is a circuit diagram illustrating a conventional power amplifier. Referring to FIG. 1, the traditional power amplifier performs matching with respect to an input signal through an input matching network and carries out 1:n matching with respect to an output signal through an impedance transformation section 100. Such an impedance transformation section 100 may be formed using an LC resonant impedance transformation network illustrated in FIG. 2A.

FIG. 2B illustrates a smith chart showing impedance transformation of the LC resonant impedance transformation network illustrated in FIG. 2A.

Although the power amplifier illustrated in FIG. 1 has a simple structure, it is difficult to realize an "on-chip structure" using one chip due to the use of lumped elements. In addition, although the power amplifier is realized as the "on-chip" according to a CMOS technique, it is difficult to solve a problem of loss due to a substrate. Furthermore, it is necessary to use an external choke inductor and a bypass capacitor. Because transistors are concentrated on one spot, high temperature heat is generated, degrading the reliability of the power amplifier.

FIG. 3 is a circuit diagram illustrating a conventional power amplifier disclosed in U.S. Pat. No. 6,359,513. The conventional power amplifier disclosed in U.S. Pat. No. 6 359,513 illustrated in FIG. 3 is constructed using the LC resonant impedance transformation network based on a differential push-pull theory.

Although the power amplifier illustrated in FIG. 1 can be realized in an on-chip inductor structure, remarkable power consumption occurs due to a low substrate resistivity and a serious metal ohmic loss of the power amplifier. In addition, a great amount of heat occurs because transistors are concentrated on one spot, and a problem of a break down voltage may occur because a great drain voltage is applied to all transistors. Furthermore, the size of the power amplifier may increase because a chalk inductor and a bypass capacitor are used for a drain stage of a transistor.

Referring to FIG. 3, a class F power amplifier is realized through the CMOS technique, and this amplifier removes even order harmonics in a differential push-pull structure. Accordingly, this amplifier does not require an additional circuit for the second harmonic tuning, and is designed to reduce the third harmonic by controlling the phase of a differential input. However, even this amplifier causes power consumption due to passive components.

The structure of "DAT (Distributed active transformer)" disclosed in U.S. Pat. No. 6,737,948, which is illustrated in FIG. 4, has been suggested by compensating for structural disadvantages of three amplifiers such as a power amplifier through LC matching described above, a power amplifier in the structure of a "on chip spiral transformer", and a power amplifier in a CMOS push-pull structure.

The conventional amplifier illustrated in FIG. 4 has the same advantages as the differential push-full power amplifier illustrated in FIG. 3 and the structure enabling CMOS on-chip. In addition, transistors are not concentrated but distributed, so the amplifier can be strong against a breakdown voltage and a temperature. However, the power amplifier illustrated in FIG. 4 degrades the efficiency thereof because a K factor (coupling coefficient) has a value within the range of 0.5 to 06. Furthermore, a quality factor of secondary winding Q2 must be lowered in accordance with an impedance transformation ratio.

In addition, the power amplifier illustrated in FIG. 4 has a current crowding effect and generates an unbalanced input signal due to input feed line coupling, thereby causing serious performance degradation.

SUMMARY OF THE INVENTION

Accordingly, the present invention has been designed to solve the above and other problems occurring in the prior art.

An object of the present invention is to provide a power amplifier capable of improving efficiency and maximizing output thereof by enhancing a K factor, which may cause a problem in a power amplifier having a distributed active transformer structure.

To accomplish the above and other objects, there is provided an on-chip complementary metal-oxide semiconductor (CMOS) power amplifier having an improved efficiency and being fabricated in a small size. The on-chip CMOS power amplifier includes a primary winding located at a first layer, secondary windings located at a second layer, which is an upper part of the first layer, the secondary windings being located corresponding to a position of the primary winding, and a cross section for coupling the second windings with each other.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENT

Figure 1:
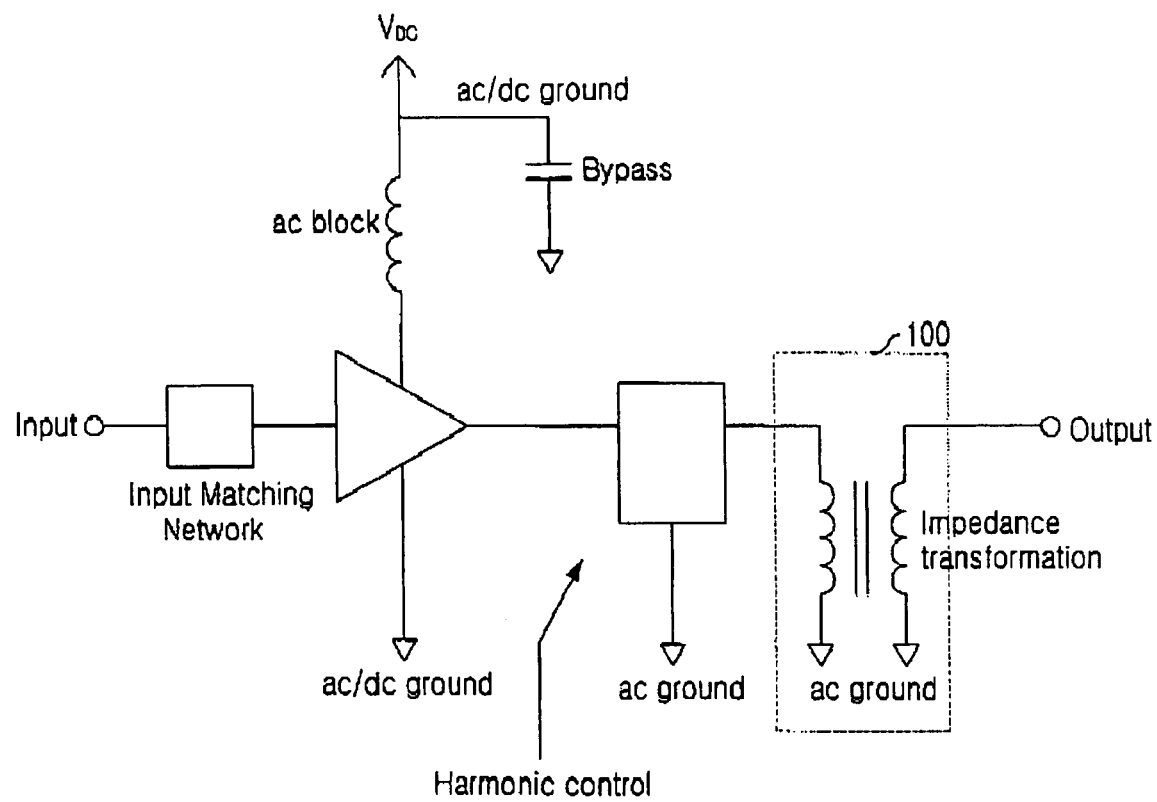
FIG. 1 is a circuit diagram illustrating a conventional power amplifier.
Figure 2A:
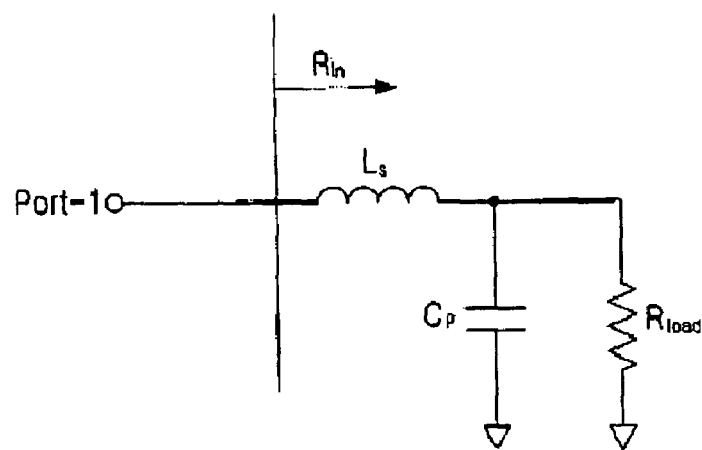
FIG. 2A is a circuit diagram illustrating a conventional LC resonant impedance transformation network.
Figure 2B:
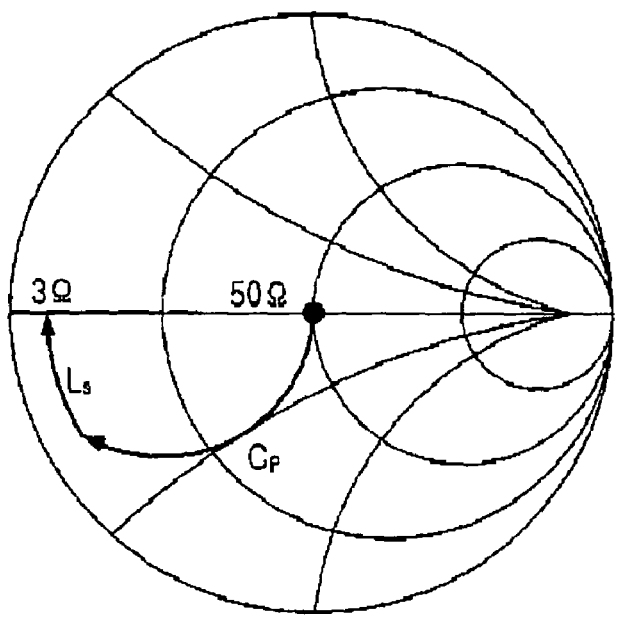
FIG. 2B illustrates a smith chart showing impedance transformation of an LC resonant impedance transformation network illustrated in FIG. 2A.
Figure 3:
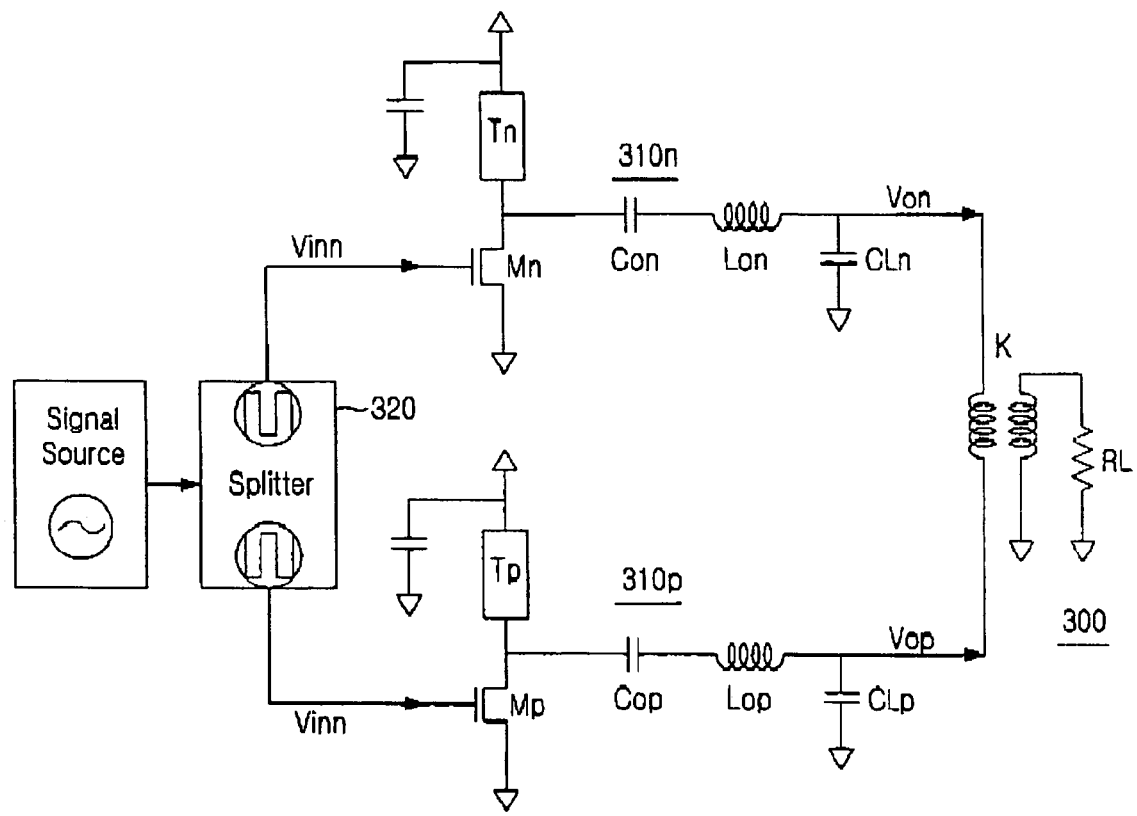
FIG. 3 is a circuit diagram illustrating a conventional power amplifier disclosed in U.S. Pat. No. 6,359,513.
Figure 4:
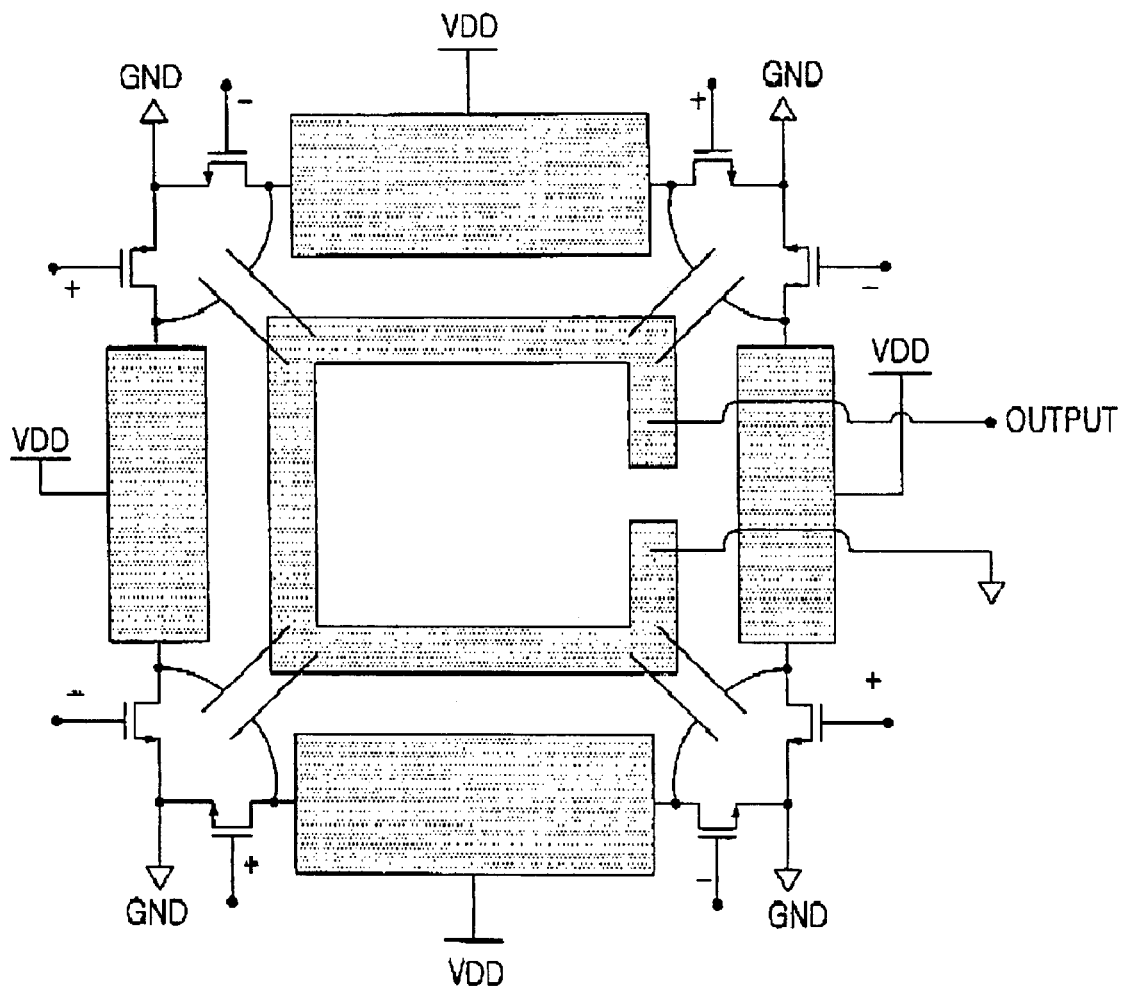
FIG. 4 is a view illustrating a conventional amplifier as disclosed in U.S. Pat. No. 6,737,948

Hereinafter, preferred embodiments of the present invention will be described in detail with reference to the accompanying drawings. It is noted that the same or similar components in drawings are designated by the same reference numerals as far as possible although they are shown in different drawings. Additionally, in the following description of the present invention, a detailed description of known functions and configurations incorporated herein will be omitted when it may make the subject matter of the present invention rather unclear.

Figure 5A:
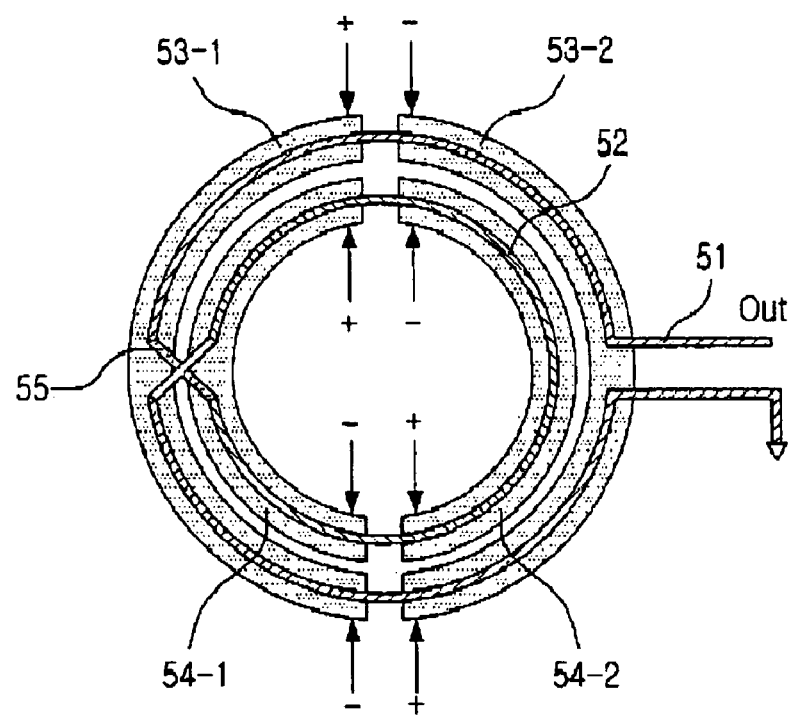
FIGS. 5A through 5C are views illustrating an on-chip CMOS power amplifier having an improved efficiency in a small size.
Figure 5B:
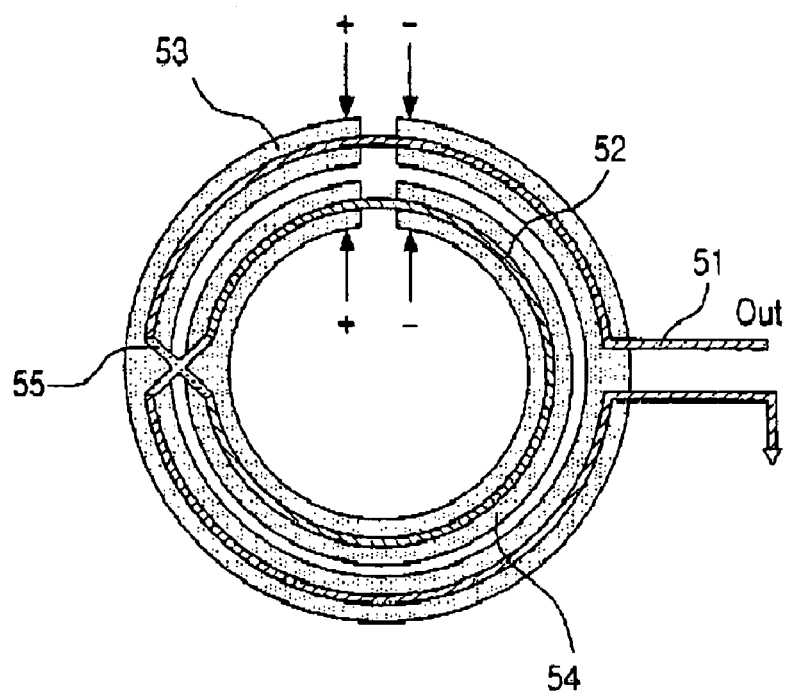
Figure 5C:
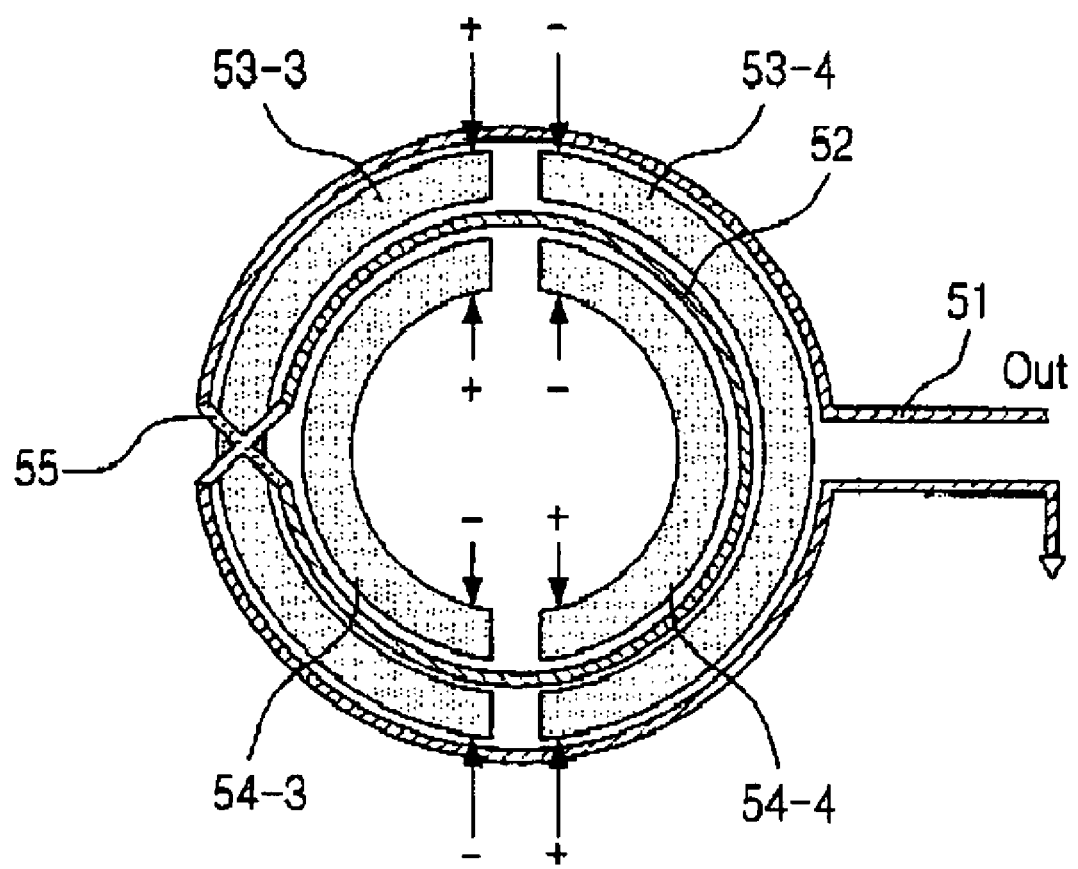

FIGS. 5A to 5C are views illustrating an on-chip CMOS power amplifier having an improved efficiency in a small size according to an embodiment of the present invention. More specifically, FIGS. 5A to 5C illustrate an on-chip CMOS power amplifier having an improved efficiency in a small size where an optimized Q transformer is easily realized and a primary winding and a secondary winding are placed on an upper layer and a lower layer by changing positions of the primary winding and the secondary winding from the distributed active transformer (DAT) having a planar structure where the primary winding and the secondary winding are placed inside and outside of one layer.

As described above, the secondary winding is positioned through the change of a layer so that the turn of the secondary winding can be easily changed. That is, the on-chip CMOS power amplifier has flexibility so that an impedance value viewed from a drain of an NMOS transistor can be easily changed. In addition, the secondary winding is realized using a double layer, making it is possible to prevent the increase of an effective resistance due to a current crowding effect derived from the planar structure.

Further, it is possible to obtain a value of a superior Q2 (the quality factor of the secondary winding) by increasing the thickness of metal forming the secondary winding through the improvement of a process for a CMOS of 0.13 um A multi-turn of the primary winding and the secondary winding is easily realized by using the double layer, so that it is possible to reduce the size of the on-chip CMOS power amplifier.

Referring to FIG. 5A, the on-chip CMOS power amplifier having an improved efficiency in a small size according to an embodiment of the present invention includes four primary windings 53-1, 53-2, 54-1, and 54-2, which are positioned at a first layer. The secondary windings 51 and 52 make two layers in a position corresponding to those of the primary windings 53-1, 53-2, 54-1, and 54-2, and a cross section 55 connects the external secondary winding 51 to the internal secondary winding 52.

In the on-chip CMOS power amplifier, an equivalent circuit is realized using four pairs of NMOS transistors. That is, each of the primary windings 53-1, 53-2, 54-1, and 54-2 and each of the secondary windings 51 and 52 may be realized as a pair of NMOS transistors.

Figure 6:
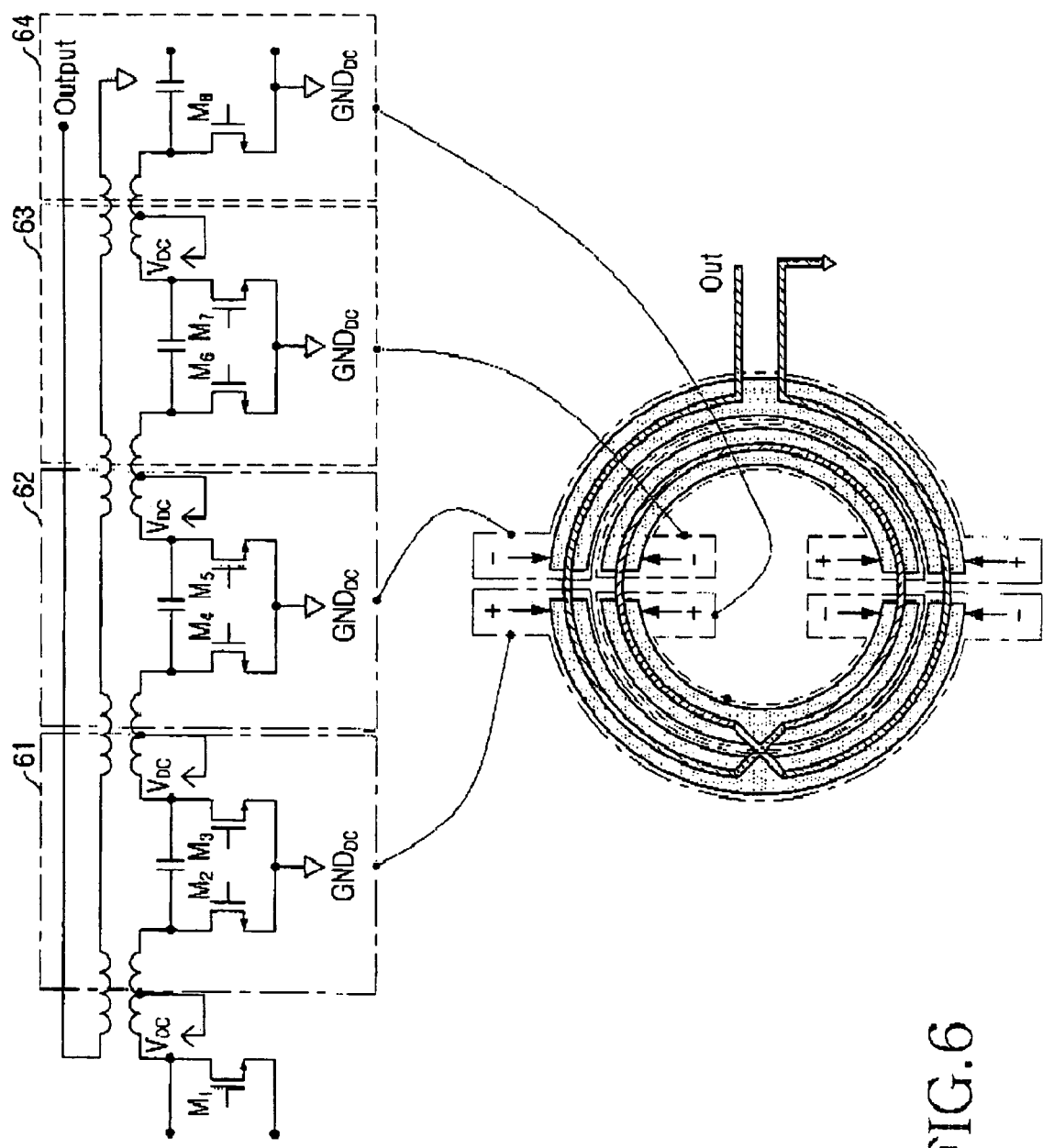
FIG. 6 is a circuit diagram illustrating an equivalent circuit of the CMOS power amplifier illustrated in FIGS. 5A through 5C.

FIG. 6 is a circuit diagram illustrating an equivalent circuit of the CMOS power amplifier illustrated in FIGS. 5A through 5C. As illustrated in FIG. 6, the primary winding 53-1 and the secondary winding 51 may be realized as one plush full amplifier. Similarly, the primary winding 53-2 and the secondary winding 51 may be used for realizing a push-pull amplifier illustrated through reference numeral 62. The primary winding 54-1 and the secondary winding 52 may be used for realizing a push-pull amplifier shown through reference numeral 64. In addition, the primary winding 54-2 and the secondary winding 52 may be used for realizing a push-pull amplifier illustrated by reference numeral 63. Each of push-pull amplifiers will be described in more detail with reference to FIGS. 7A and 7B.

As described above, in the structure of power-combining four push-pull amplifiers, secondary winding metal at the lower layer acts as magnetic pick up of output power. That is, if a fundamental ac current flows through the primary winding by the four push-pull amplifiers, an ac magnetic field is induced into the secondary winding loop. Therefore, a voltage corresponding to the sum of differential voltages of the push-pull amplifiers is output by the induced magnetic field.

The on-chip CMOS power amplifier having an improved efficiency in a small size constructed as describe above according to an embodiment of the present invention performs the same operation as the DAT of the conventional power amplifier disclosed in U.S. Pat. No. 6,737,948. However, according to the present invention, the primary winding is coupled with the secondary winding by employing the upper and lower layers instead of the planar structure, so that it is possible to increase a K factor, which is a factor of a coupling.

FIG. 5B illustrates the structure capable of minimizing input feed line coupling according to another embodiment of the present invention, in addition to the embodiment illustrated in FIG. 5A.

Further, a CMOS power amplifier illustrated in FIG. 5C has the same structure as that illustrated in FIG. 5A except that the CMOS power amplifier illustrated in FIG. 5C has the secondary winding positioned at the upper and lower layers outside of the primary winding, while the CMOS power amplifier illustrated in FIG. 5A has the secondary winding positioned at the upper part of the primary winding. Therefore, FIG. 5C illustrates a CMOS power amplifier according to an embodiment of the present invention, which can remove parasitic capacitances between the primary windings 53-3, 53-4, 54-3, and 54-4 and the secondary windings 51 and 52 from the structure of the CMOS power amplifier illustrated in FIG. 5A. The structure illustrated in FIG. 5C has the K factor of 0.7 higher than 0.5 of the conventional power amplifier disclosed in U.S. Pat. No. 6,737,948 and reduces parasitic capacitances. That is, the structure illustrated in FIG. 5C allows the trade off between the K factor and the parasitic capacitance values.

The planar structure of the conventional DAT has the primary winding and the secondary winding formed at the same layer, thereby driving induced currents of the windings to both ends of the secondary winding. Therefore, currents are crowed at both ends of the secondary winding. However, if a power amplifier has the layer structure according to an embodiment of the present invention, induced currents are entirely distributed on the surface of the secondary winding, making it is possible to largely increase the value of a K factor and reduce a current crowding effect.

Because the K factor affects the efficiency and the maximum output of a power amplifier, it is important to increase the value of the K factor to "1". However, it is difficult to increase the value of the K factor based on the planar structure disclosed in the U.S. Pat. No. 6,737,948.

However, as the value of the K factor is increased through the layer structure according to an embodiment of the present invention, it is possible to increase an output transformer efficiency (hout). Therefore, it is possible to increase a drain efficiency, a power amplifier efficiency (PAE), and $P_{out}$. This occurrence is can be shown using Equation (1)

$$\eta = \frac{P_{out}}{P_{DC}} \qquad (1)$$

$$= \frac{P_{out}}{n \cdot V_{dd} \cdot I_{dd}}$$

$$= \frac{P_{out}}{n \cdot V_{dd} \cdot (V_{dd} - V_k)/P_\mu}$$

$$PAE = \eta \cdot \left(1 - \frac{1}{G}\right)$$

$$= \frac{P_{out}}{n \cdot V_{dd} \cdot (V_{dd} - V_k)/P_\mu} \cdot \left(1 - \frac{1}{\eta_{in} \cdot g_m^2 \cdot p_\mu \cdot R_g \cdot \eta_{out}}\right)$$

$$\eta MAX = \frac{n \cdot \frac{(V_{dd} - V_k)^2}{2P_\mu} \cdot \eta_{out}}{n \cdot V_{dd} \cdot (V_{dd} - V_k)/P_\mu}$$

$$= \frac{1}{2}\left(1 - \frac{V_k}{V_{dd}}\right) \cdot \eta_{out}$$

In Equation (1), the $n_{out}$ denotes the output transformer efficiency.

The on-chip CMOS power amplifiers having an improved efficiency in a small size according to embodiments of the present invention illustrated in FIGS. 5A to 5C perform the same operations as the DAT of the conventional power amplifier disclosed in U.S. Pat. No. 6,737,948.

Figure 7A:
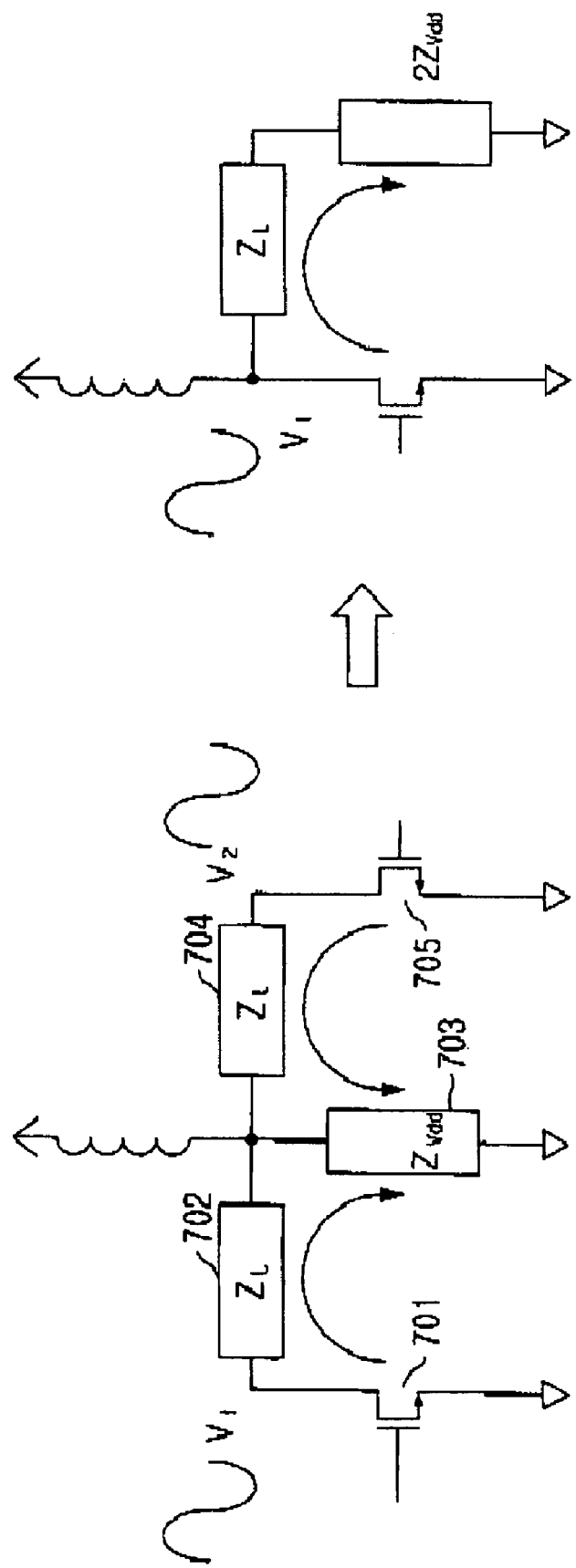
FIGS. 7A and 7B are circuit diagrams illustrating a fundamental push-full amplifier with a pair of NMOS transistors.
Figure 7B:
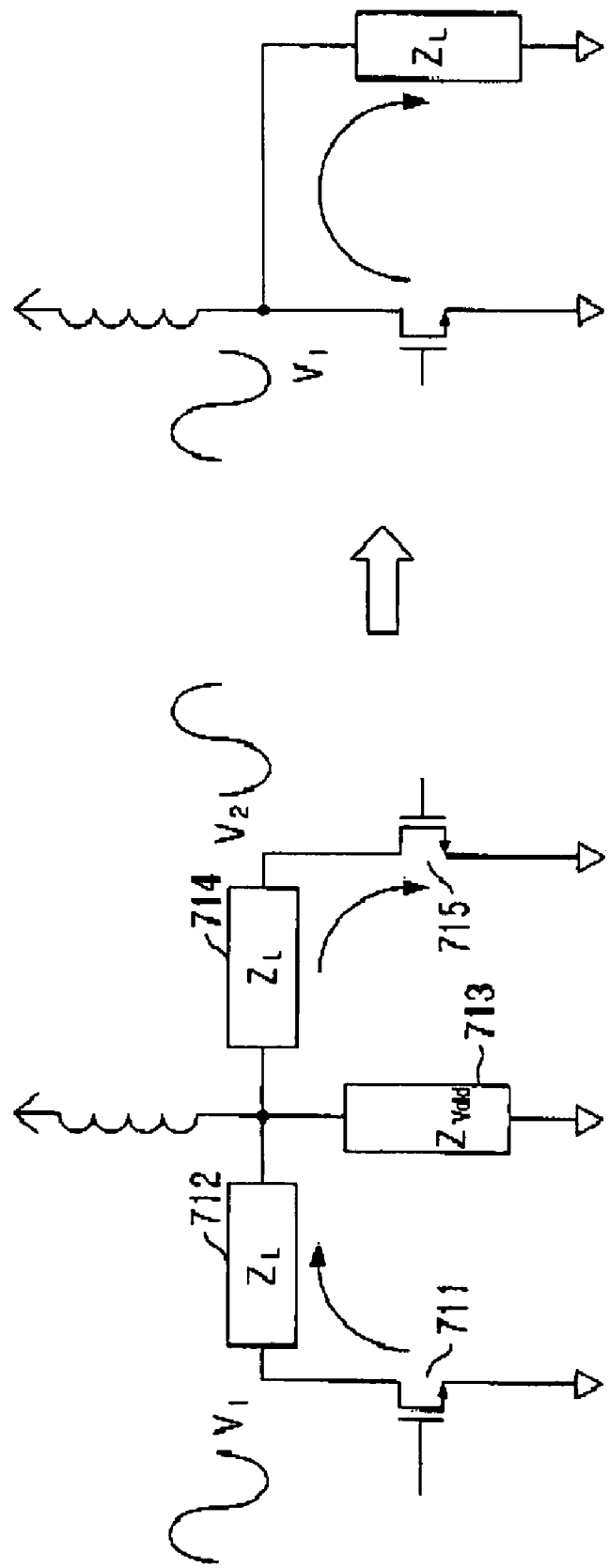

The fundamental circuit diagrams of the push-full power amplifier including a pair of NMOS transistors of FIG. 6 are illustrated in FIGS. 7A and 7B. As illustrated in FIG. 7A, the push-full amplifier with a pair of NMOS transistors includes a first NMOS transistor 701 and a second NMOS transistor 705 opposite to each other, a first impedance $z_L$ 702 and a second impedance $z_L$ 704 connected to a drain of the first NMOS transistor 701 and a drain of the second NMOS transistor 705, respectively, and a third impedance $z_{Vdd}$ 703 for a drain voltage. When currents (even harmonic signals)

of the first and second NMOS transistors 701 and 705 flow in gate-drain direction of the first and second NMOS transistors, respectively, a circuit serially connecting a drain of the first NMOS transistor 701 to the first impedance $z_L$ 702 and the third impedance $z_{Vdd}$ 703 is formed.

As illustrated in FIG. 7B, the push-full amplifier with a pair of NMOS transistors includes a first NMOS transistor 711 and a second NMOS transistor 715 opposite to each other, a first impedance $z_L$ 712 and a second impedance $z_L$ 714 connected to a drain of the first NMOS transistor 711 and a drain of the second NMOS transistor 715, respectively, and a third impedance $z_{Vdd}$ 713 for a drain voltage. When a current (an odd harmonic signal) of the first NMOS transistor 711 flows in a gate-drain direction of the first NMOS transistor, and a current (an odd harmonic signal) of the second NMOS transistor 715 flows in a drain-gate direction, a circuit serially connecting the first impedance $z_L$ 712 to a drain of the first NMOS transistor 711 is formed.

In Equation (2) below, which represents the push-full amplifier with a pair of NMOS transistors, the drain voltage $V_1$ of the first NMOS transistor is obtained.

$$V_1 = A_1 \cos(wt+\theta_1) + A_2 \cos(2wt+\theta_2) + A_3 \cos(3wt+\theta_3) + \ldots \quad (2)$$

The drain voltage $V_2$ of the second NMOS transistor is obtained through Equation (3).

$$V_2 = A_1 \cos(wt+\theta_1+\pi) + A_2 \cos(2wt+\theta_2+\pi) + A_3 \cos(3wt+\theta_3+\pi) + \ldots \ V_2 = A_1 \cos(wt+\theta_1) + A_2 \cos(2wt+\theta_2) + A_3 \cos(3wt+\theta_3) + \ldots \quad (3)$$

The subtraction of the $V_1$ and $V_2$ are obtained through Equation (4).

$$V_2 = 2A_1 \cos(wt+\theta_1) + 2A_3 \cos(3wt+\theta_3) + A_5 \cos(5wt+\theta_5) + \ldots \quad (4)$$

In the equations above, the $A_n$ and the $\theta_n$ denote a level and a phase of $n^{th}$ harmonic voltage existing in a drain of a transistor.

As shown through Equation (4), the differential output signal does not generate an even harmonic component. The even harmonic component is easily removed by the circuit symmetry, and an odd harmonic component may be removed using a resonant circuit added to the drain.

Accordingly, only DC power and even harmonic current are supplied through a lossy bias line, and fundamental frequencies and an odd harmonic current make a virtual ac ground between a power supply and a ground. The virtual ac ground lowers the loss of the fundamental frequency current and provides a low impedance to the fundamental frequency current. Accordingly, an on-chip chalk inductor and an on-chip bypass capacitor due to loss are not required. This is an advantage of a differential push-full structure and is described above.

Figure 8A:
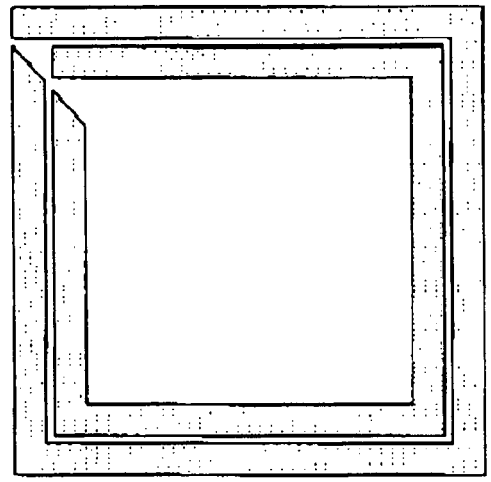
FIGS. 8A to 8B are views illustrating an ASITIC simulation result for the planar DAT disclosed in the U.S. Pat. No. 6,737,948.
Figure 8B:
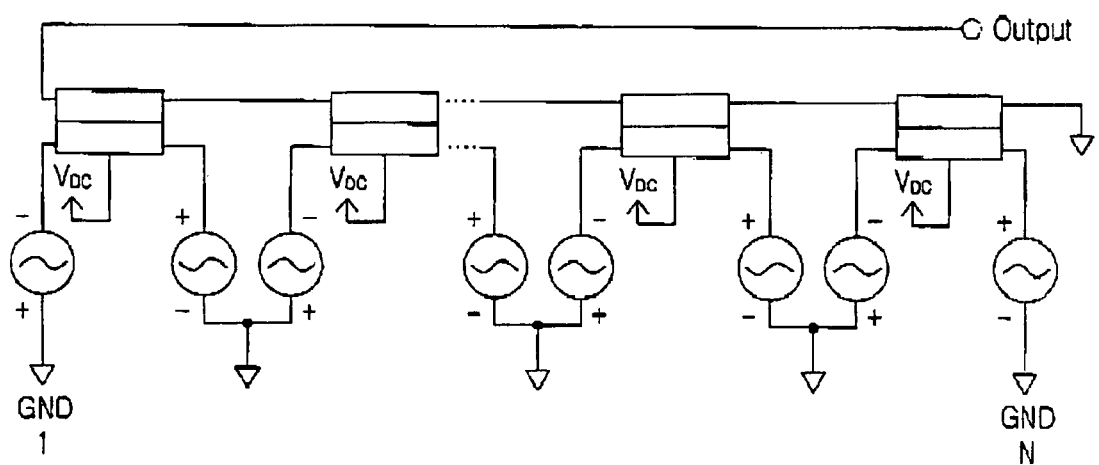

FIGS. 8A to 8B are views illustrating an ASITIC simulation result for the planar DAT disclosed in the U.S. Pat. No. 6,737,948 to prove availability of the on-chip CMOS power amplifier having an improved efficiency in a small size according to an embodiment of the present invention. It can be confirmed that the value of the K factor of the planar DAT disclosed in the U.S. Pat. No. 6,737,948 is 0.512, and the size of the planar DAT corresponds to 136900 $um^2$.

The results of the simulation are shown in detail through Table 1.

TABLE 1

ASITIC>
Square spiral <M0> has the following geometry:

TABLE 1-continued

L1=300.00, L2=300.00, W=30.00, S=1.00, N=1.00
Total length= 1064.00(um ), Total Area = 31920.00um²
Located at (150.00, 150.00)
ASITIC>
Inductance of M0=0.609295(Nh)
Square spiral <M0> has the following geometry:
L1=370.00, L2=370.00, W=30.00, S=1.00, N=1.00
Total length= 1344.00(um ), Total Area = 40320.00um²
Located at (115.00, 115.00)
ASITIC>
Inductance of M0=0.829547(nH)
Coupling coefficient of M0 and M01:k=0.5120 or M=0.3640(Nh)
Size = 136900 μm²

Figure 9A:
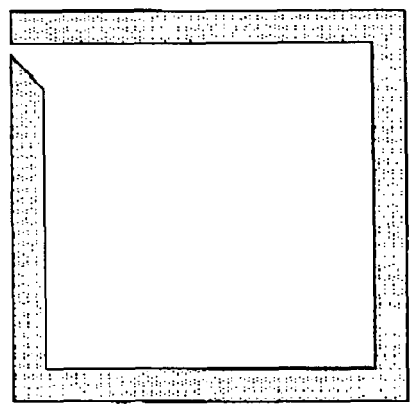
FIGS. 9A and 9B are views illustrating an ASITIC simulation result for the structure of the on-chip CMOS power amplifier having an improved efficiency in a small size according to an embodiment of the present invention.
Figure 9B:
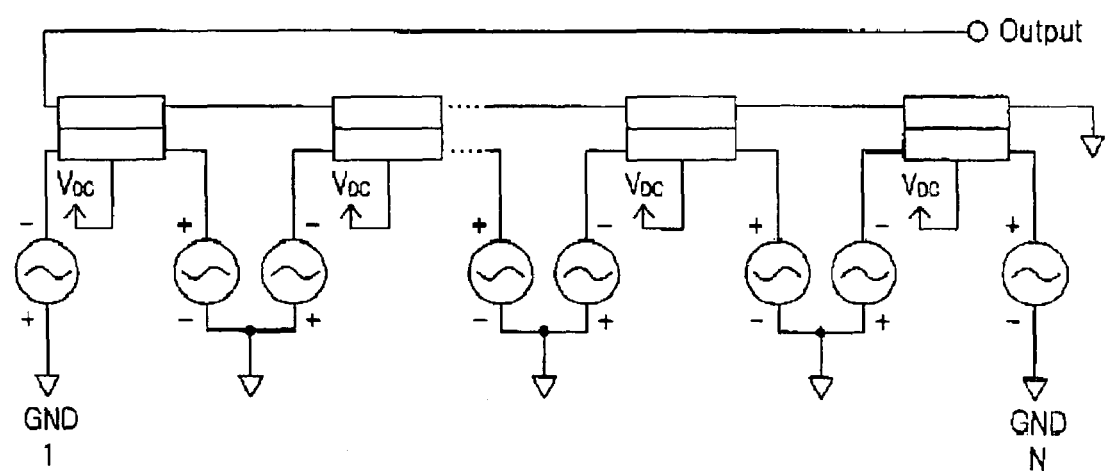

FIGS. 9A and 9B are views illustrating an ASITIC simulation result for the on-chip CMOS power amplifier having an improved efficiency in a small size according to an embodiment of the present invention in order to prove availability of the on-chip CMOS power amplifier having an improved efficiency in a small size according to an embodiment of the present invention. In particular, as illustrated in FIG. 9A, because the on-chip CMOS power amplifier has a stack structure, conductors (metals) of a first layer and a second layer are aligned while precisely matching each other, such that the lower layer is not viewed from a top of the stack structure.

The on-chip CMOS power amplifier illustrated in FIG. 5A, having an improved efficiency in a small size according to the present invention, has the value of the K factor corresponding to 0.9078. It can be understood that this value 0.9078 of the K factor is superior to the value 0.512 of the K factor confirmed with respect to FIGS. 8A and 8B. In addition, the size of the power amplifier corresponds to 90000 um², and this shows that the size of the power amplifier is reduced by 1.5 times the size of the conventional amplifier disclosed in the U.S. Pat. No. 6,737,948.

The simulation result is shown in detail through Table 2.

TABLE 2

Figure 10A:
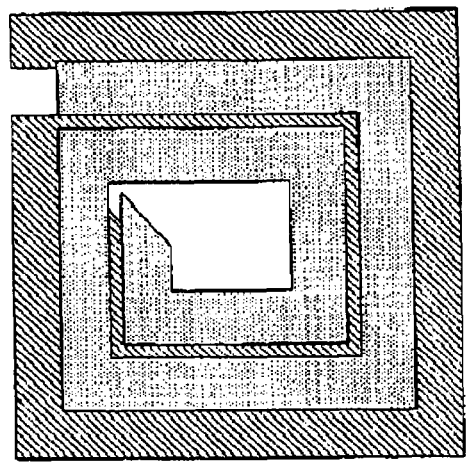
FIGS. 10A and 10B are views illustrating an ASITIC simulation result for an on-chip CMOS power amplifier having an improved efficiency in a small size according to an embodiment of the present invention.
Figure 10B:
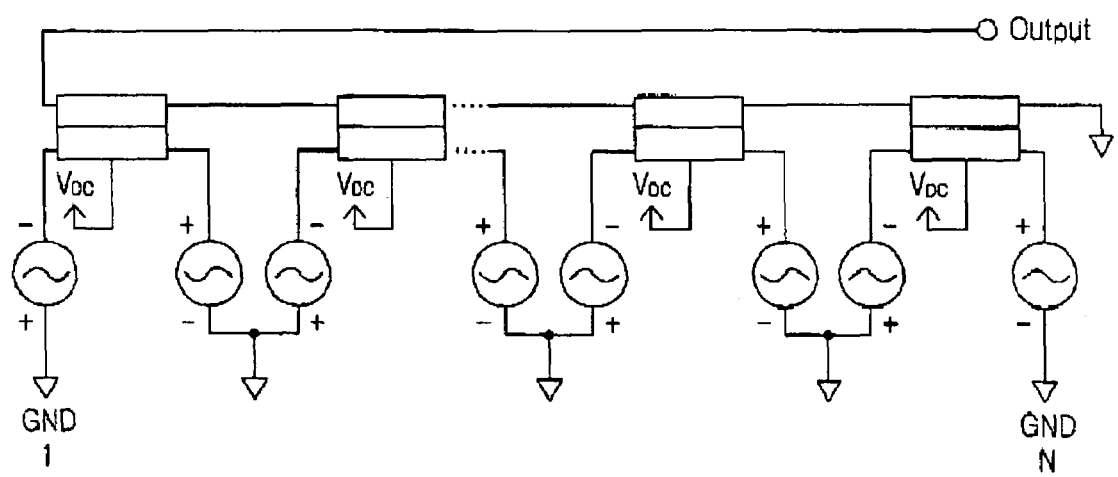

ASITIC>
Square spiral <M0> has the following geometry:
L1=300.00, L2=300.00, W=30.00, S=1.00, N=1.00
Total length= 1064.00(um ), Total Area = 31920.00um²
Located at (150.00, 150.00)
ASITIC>
Inductance of M0=0.609295(Nh)
Square spiral <M0> has the following geometry:
L1=300.00, L2=300.00, W=30.00, S=1.00, N=1.00
Total length= 1064.00(um ), Total Area = 31920.00um²
Located at (115.00, 115.00)
ASITIC>
Inductance of M0=0.609295(nH)
Coupling coefficient of M0 and M01:k=0.9078 or M=0.5531(nH)
Size = 90000 μm² -> 35%area save FIGS. 10A and 10B are views illustrating an ASITIC simulation result for the structure of the on-chip CMOS power amplifier having an improved efficiency in a small size according to a third embodiment of the present invention in order to prove availability of the on-chip CMOS power amplifier having an improved efficiency in a small size according to an embodiment of the present invention. More specifically, FIG. 10A illustrates an integrated layer structure similar to that illustrated in FIG. 9A, and the first layer and the second layer are misaligned somewhat such that a parasitic capacitance can be reduced between the first layer and the second layer.

The on-chip CMOS power amplifier illustrated in FIG. 5C, having an improved efficiency in a small size according to the third embodiment of the present invention, has the value of the K factor corresponding to 0.7748. According to the present invention, the parasitic capacitance between the first layer and the second layer is reduced, and the simulation result is shown in more detail in Table 3.

TABLE 3

Figure 11A:
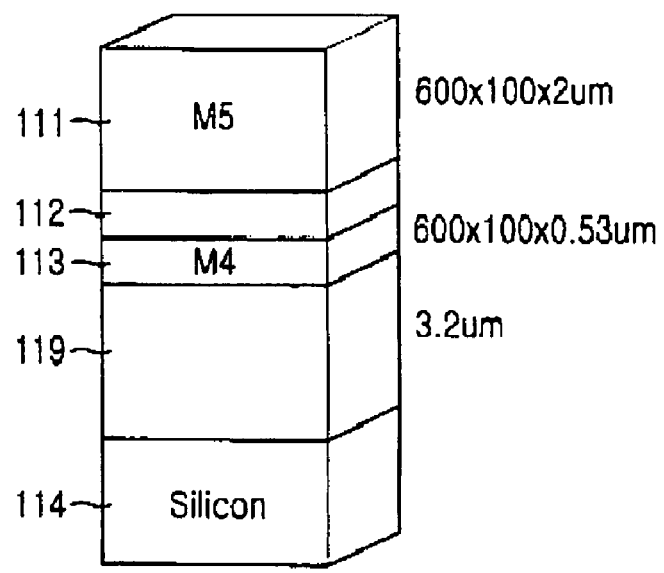
FIGS. 11A and 11B are views illustrating performance of the CMOS power amplifiers according to the present invention and the conventional planar power amplifier.
Figure 11B:
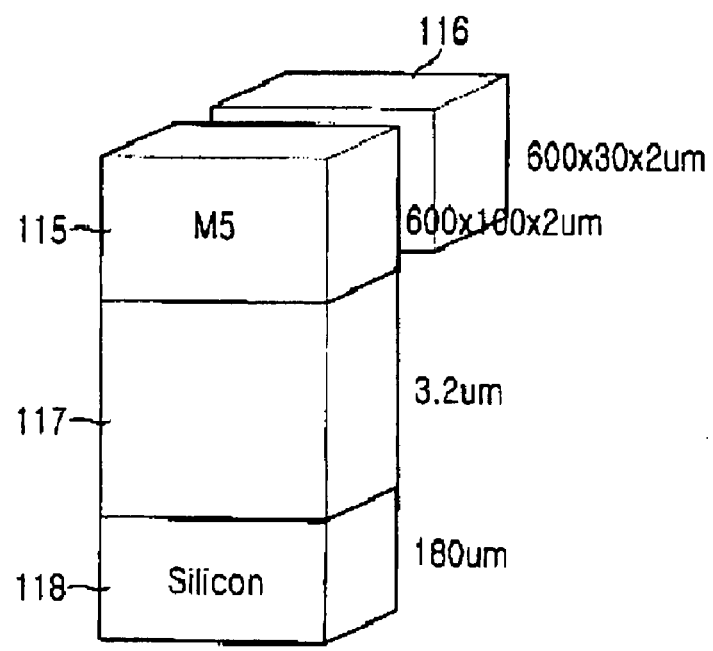

ASITIC>
Square spiral <M0> has the following geometry:
L1=2300.00, L2=230.00, W=30.00, S=20.00, N=2.00
Total length= 1165.00(um ), Total Area = 34950.00um$^2$
Located at (150.00, 150.00)
ASITIC>
Inductance of M0=0.688225(nH)
Square spiral <M0> has the following geometry:
L1=190.00, L2=190.00, W=30.00, S=2.00, N=2.00
Total length= 1007.00(um ), Total Area = 30210.00um$^2$
Located at (115.00, 115.00)
ASITIC>
Inductance of M01 = 0.612891 (nH)
ASITIC>
Coupling coefficient of M0 and M01:k=0.77488 or M=0.50321(nH)
Size = 52900 μm$^2$ -> 61%area save FIGS. 11A and 11B are views illustrating performance of the CMOS power amplifiers according to the present invention and the conventional planar power amplifier. More specifically, the power amplifiers illustrated in FIGS. 11A and 11B include silicon layers 114 and 118 having the thickness of 180 μm formed on a base layer, insulating layers 119 and 117 having the thickness of 3.2 μm formed on the silicon layers 114 and 118, respectively, and conductors 111, 113, 115, and 116 formed on the insulating layers 113 and 117.

When constructing the conductors, the conventional planar DAT illustrated in FIG. 11B aligns the conductor M4 116 of 600×30×2 μm in parallel to the conductor M5 115 of 600×100×2 μm and reduces the distance between the conductor M4 116 and the conductor M5 115. In this case, a drain efficiency and an output power $P_{out}$ correspond to 55% and 2 W, respectively.

When constructing the conductors, the CMOS power amplifier according to the present invention as illustrated in FIG. 11A separates the conductor of 600×100×2 μm from the conductor of 600×30×0.53 μm using a thin dielectric film such that they are vertically coupled with each other while interposing the thin dielectric film therebetween. Accordingly, the drain efficiency and the output power correspond to 57% and 4 W, respectively.

Accordingly, it can be understood that the CMOS power amplifier according to the present invention has an improved efficiency and increases power by 100%.

In the CMOS power amplifier according to the present invention, elements are not coupled in parallel with each other, but coupled longitudinally to each other, such that the distance between coupling planes is relatively narrowed as compared with that of the conventional planar DAT. For example, in FIGS. 11A and 11B, the distance between the M5 layer 111 and the M4 layer 113 in the CMOS power amplifier is still narrower than a distance between the M5 layer 111 and the M4 surface 116 in the conventional planar DAT.

Accordingly, the CMOS power amplifier according to the present invention has an unnecessary parasitic capacitance generated between the M5 surface 111 and the M4 surface 113. Although the structure illustrated in FIG. 5C is suggested in order to reduce such a parasitic capacitance, this structure cannot entirely remove the influence of the parasitic capacitance.

In addition, because this parasitic capacitance is uniformly not generated according to positions, and different capacitances are generated, different loads are generated.

Figure 12:
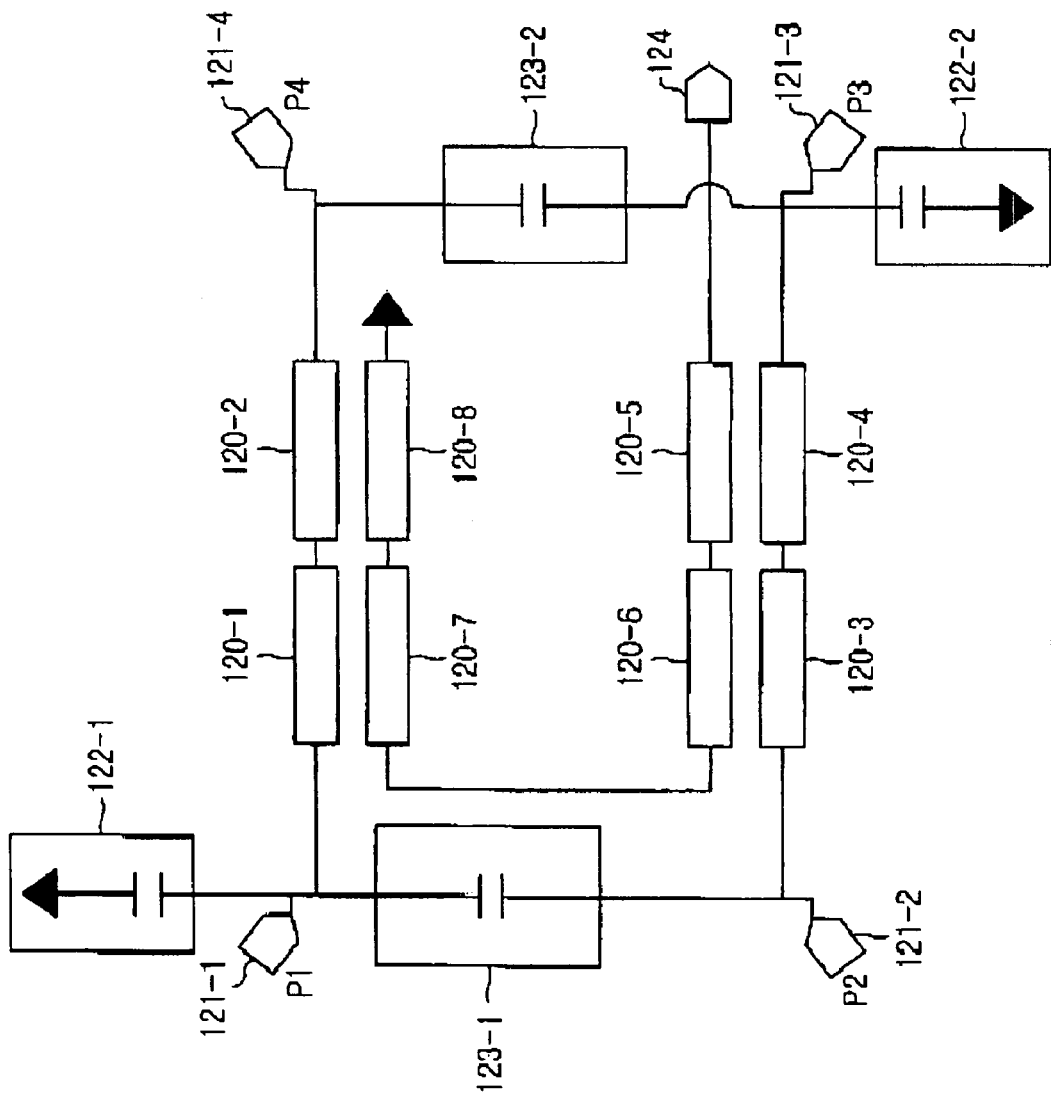
FIG. 12 is a circuit diagram for overcoming the load variation of the CMOS power amplifier according to an embodiment of the present invention.

FIG. 12 is a circuit diagram for overcoming load variation of the CMOS power amplifier according to an embodiment of the present invention. The CMOS power amplifier illustrated in FIG. 12 has the same structure as the CMOS power amplifier illustrated in FIG. 5B, except for equalization capacitance sections 122-1, 122-2, 123-1, and 123-2.

Referring to FIG. 12, P1 121-1 denotes an amp section having a (+) phase, P2 121-2 denotes an amp section having a (−) phase, P3 121-3 denotes an amp section having a (−) phase, and P4 121-4 denotes an amp section having a (−) phase. In FIG. 12, the P1 121-1, the P2 121-2, the P3 121-3, and the P4 121-4 have the same size even though they sequentially represent the phase difference of 180°.

In addition, reference numerals 120-1, 120-2, 120-3, and 120-4 are conductors and correspond to the M5 111 illustrated in FIG. 11A. Reference numeral 120-5, 120-6, 120-7, and 120-8 are conductors and correspond to the M4 113 illustrated in FIG. 11A.

In addition, reference numerals 120-1 and 120-2 are conductors and correspond to reference numeral 53 illustrated in FIG. 5B. Reference numerals 120-3 and 120-4 are conductors and correspond to reference numeral 54 illustrated in FIG. 5B.

In addition, the output of reference numeral 124 corresponds to reference numeral 51 illustrated in FIG. 5B.

As described above, a parasitic capacitance Cp1 generated between the conductor 120-1 and the conductor 120-7 acts as an input load of the P1 121-1. In addition, a parasitic capacitance Cp4 generated between the conductor 120-2 and 120-8 acts as an input load of the P4 121-4. The same manner is applied to the P2 121-2 and the P3 121-3. However, the input load of the P4 121-4 is different from the input load of the P1 121-1 because the Cp1 and the Cp4 do not have uniform sizes. Similarly, the P2 121-2 and the P3 121-3 have different input loads. That is, because the load viewed from the P1 is different from the load viewed from the P2 according to the parasitic capacitances, the P1 and the P2 do not satisfy the condition that they must have different phases and the same size. This is identically applied to the P3 and the P4.

Accordingly, the embodiment of the present invention suggests that equalization capacitance sections 122-1, 122-2, 123-1, and 123-2 are added to input parts in order to overcome a problem of load variation depending on the parasitic capacitances. That is, equalization capacitances for overcoming a problem of load variation depending on parasitic capacitances are added to the inputs, thereby allowing the inputs to have the same size. At the same time, equalization capacitances compensate parasitic capacitances generated in design so that the inputs have loads having the same intensity.

Figure 13:
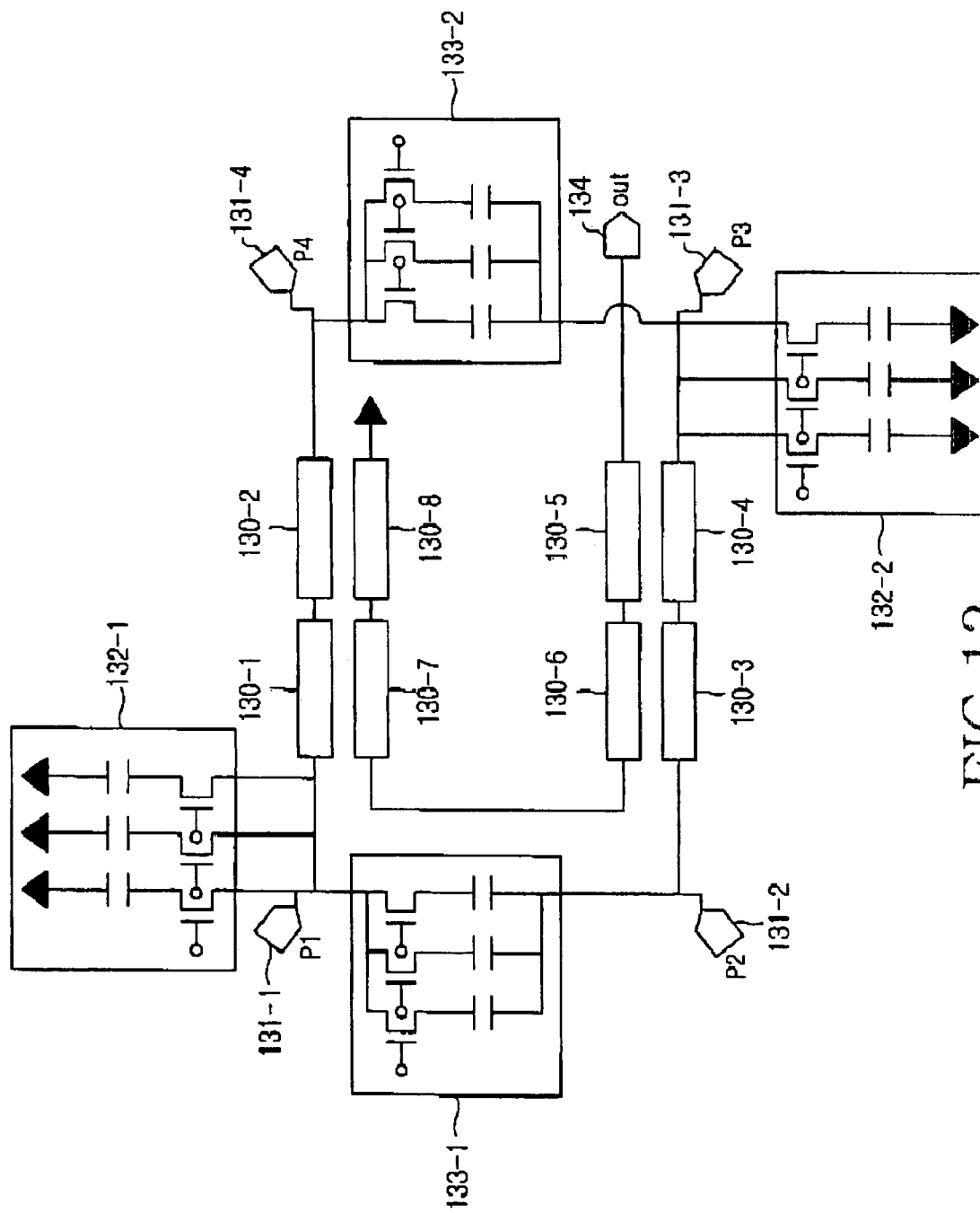
FIG. 13 is a circuit diagram of a CMOS power amplifier according to an embodiment of the present invention for solving a problem derived from load variation.

FIG. 13 is a circuit diagram of a CMOS power amplifier according to an embodiment of the present invention for solving a problem derived from load variation. The CMOS power amplifier illustrated in FIG. 13 has the same structure as the CMOS power amplifier illustrated in FIG. 5B, except for reference numerals 132-1, 132-2, 133-1, and 133-2.

Referring to FIG. 13, P1 131-1 denotes an amp section having a (+) phase, P2 131-2 denotes an amp section having a (−) phase, P3 131-3 denotes an amp section having a (−) phase, and P4 131-4 denotes an amp section having a (−)

phase. The P1 131-1, the P2 131-2, the P3 131-3, and the P4 131-4 sequentially have phase differences by 180° and have the same size.

In addition, reference numerals 130-1, 130-2, 130-3, and 130-4 are conductors, which correspond to the M5 111 illustrated in FIG. 11A. Reference numerals 130-5, 130-6, 130-7, and 130-8 are conductors, which correspond to the M4 113 illustrated in FIG. 11A.

In addition, reference numerals 130-1 and 130-2 are conductors that correspond to reference numeral 53 illustrated in FIG. 5B. Reference numerals 130-3 and 130-4 are conductors that correspond to reference numeral 54 illustrated in FIG. 5B.

In addition, the output of reference numeral 134 corresponds to reference numeral 51 illustrated in FIG. 5B.

As described above, a parasitic capacitance Cp1 generated between the conductor 130-1 and the conductor 130-7 acts as an input load of the P1 131-1. In addition, a parasitic capacitance Cp4 generated between the conductor 130-2 and 130-8 acts as an input load of the P4 121-4. The same manner is applied to the P2 131-2 and the P3 131-3. However, the input load of the P4 131-4 is different from the input load of the P1 131-1 because the Cp1 and the Cp4 do not have uniform capacitance. Similarly, the P2 131-2 and the P3 131-3 have different input loads. That is, because the load viewed from the P1 is different from the load viewed from the P2 according to parasitic capacitances, the P1 and the P2 do not satisfy the condition that they must have different phases and the same size. This is identically applied to the P3 and the P4.

Accordingly, the present invention suggests that equalization capacitance sections 132-1, 132-2, 133-1, and 133-2 are added to inputs in order to overcome a problem of load variation depending on the parasitic capacitances for the inputs. That is, equalization capacitances for overcoming a problem of load variation depending on parasitic capacitances are added to the inputs, thereby enabling the inputs to have the same size. At the same time, equalization capacitances compensate parasitic capacitances generated in so that the inputs have loads having the size.

Although the above description is identical to the description given with reference to FIG. 12, the equalization capacitance sections 132-1, 132-2, 133-1, and 133-2 are provided with reference to FIG. 13 so that they have specific capacitances according to operating frequencies f1 and f2 through connection of plural capacitors and plural switches. That is, if the operating frequency is f1, each of the equalization capacitance sections 132-1, 132-2, 133-1, and 133-2 having different capacitances powers on a specific capacitor, activates only a switch connected with the capacitor, and deactivates remaining switches connected to remaining capacitors.

This equalization capacitance sections are designed in such a manner that one of the plural capacitors is switched, so that it is possible to provide a solution about multi-band.

Figure 14:
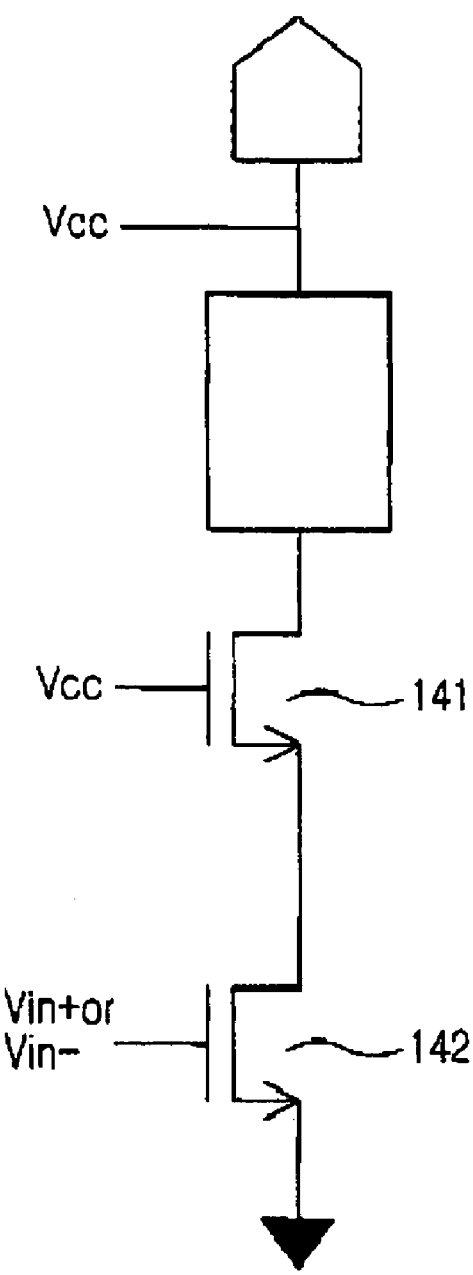
FIG. 14 is a circuit diagram illustrating a cascode amplifier applied to the CMOS power amplifier according to the present invention.

FIG. 14 is a circuit diagram illustrating a cascode amplifier applied to the CMOS power amplifier according to the present invention. Referring to FIG. 14, in the CMOS power amplifier according to the present invention, amplifiers connected to the input ports (P1,P2, P3, and P4 illustrated in FIGS. 12 and 13) are designed to have the shape of the cascode in consideration of breakdown of CMOS.

As shown in FIG. 14, according to the present invention, it is possible to provide an environment suitable for high-voltage elements through a two-stage amplifier structure (a cascode amplifier) having FETs 141 and 142.

FIGS. 15A to 15E are graphs illustrating examples of simulation results when equalization capacitances are not employed for the CMOS power amplifier according to the present invention.

Figure 15A:
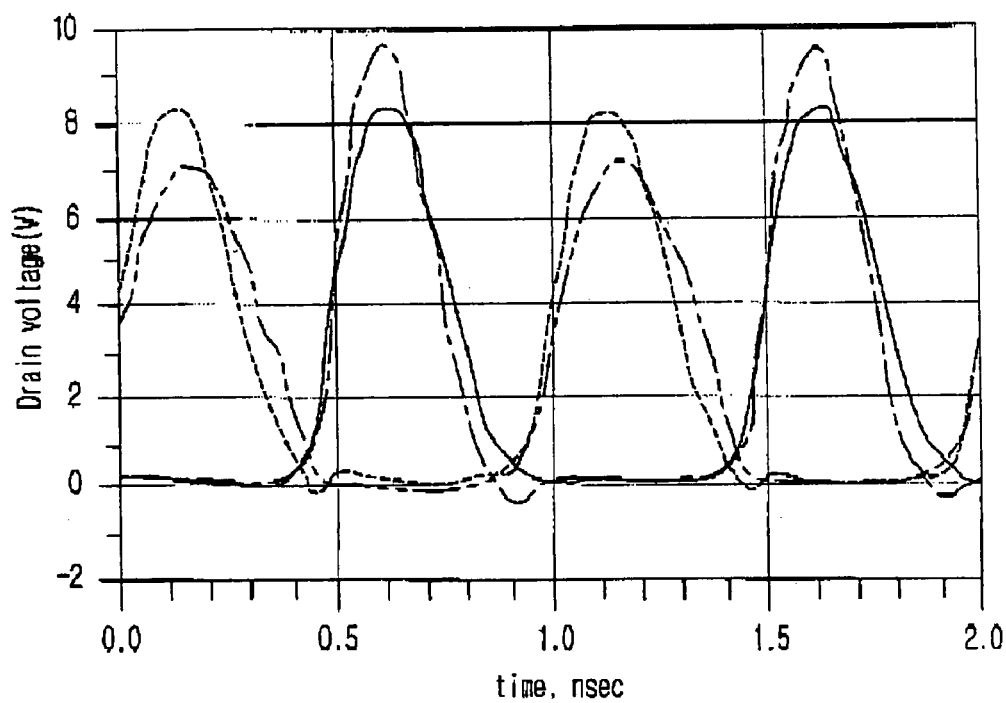
FIGS. 15A to 15E are graphs illustrating examples of simulation results when equalization capacitances are not employed for the CMOS power amplifier according to the present invention.

More specifically, FIG. 15A is a graph illustrating drain voltages according to time. Voltages at the P1, the P2, the P3, and the P4 must have opposite phases and the same level. However, the simulation result of FIG. 15A shows that the voltages have different phases and different levels due to influence of parasitic capacitances.

Figure 15B:
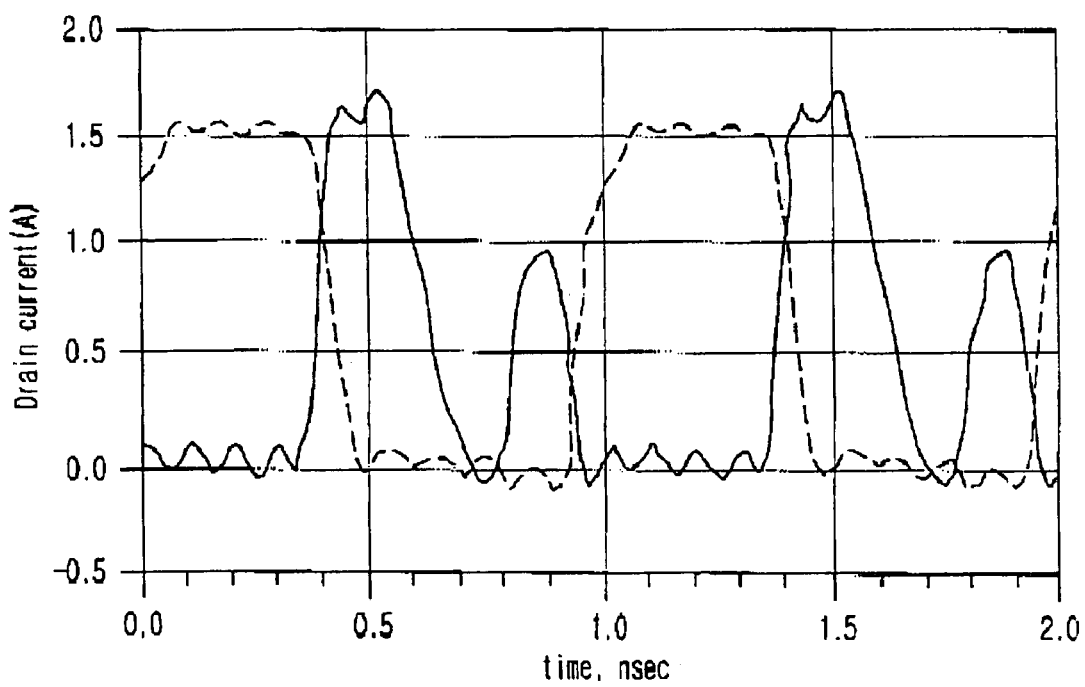

FIG. 15B is a graph illustrating drain currents according to time. Currents at the P1, the P2, the P3, and the P4 must have symmetrically opposite phases and the same level. However, the simulation result of FIG. 15B shows that the voltages have different phases and different levels due to influence of parasitic capacitances.

Figure 15C:
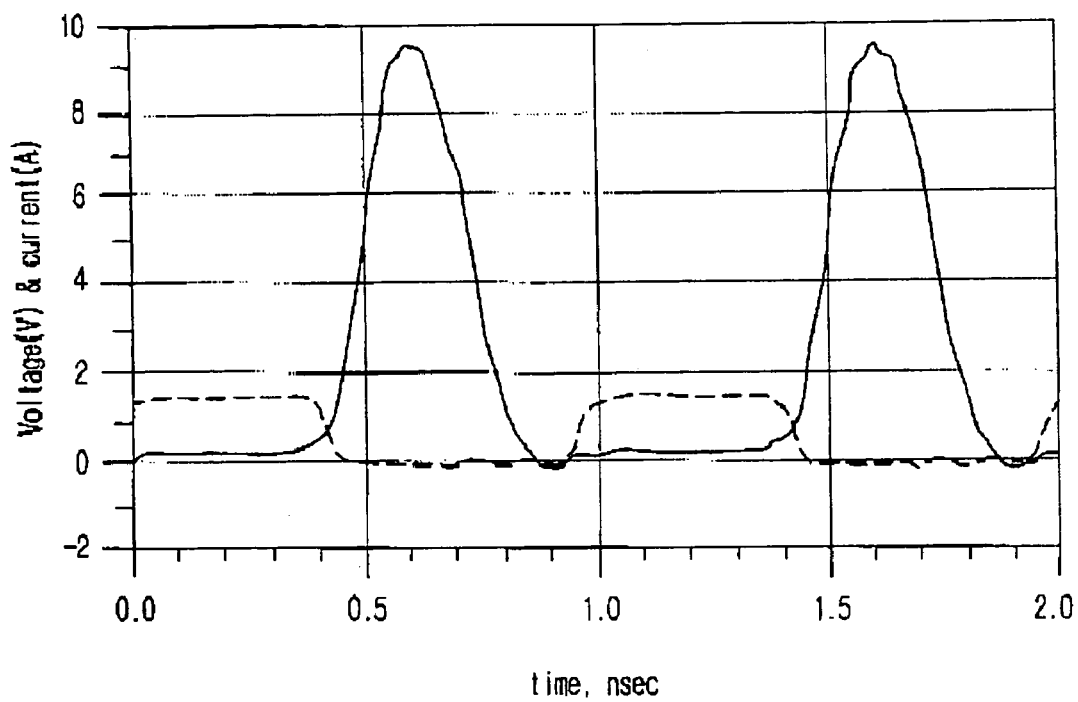
Figure 15D:
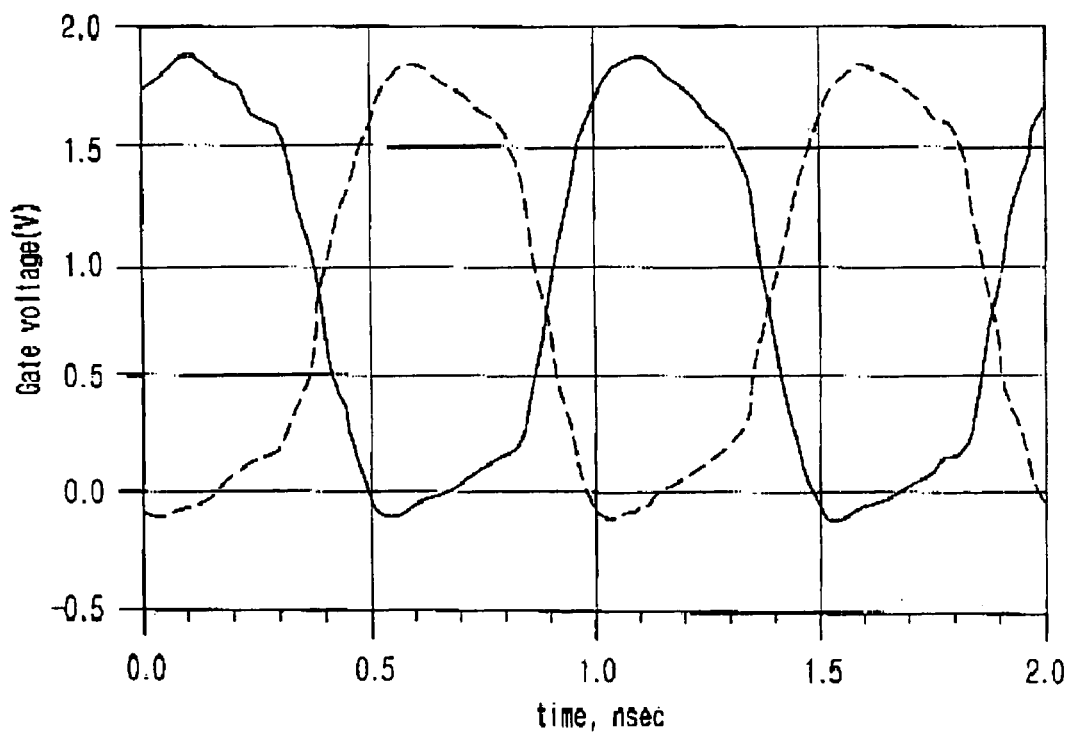
Figure 15E:
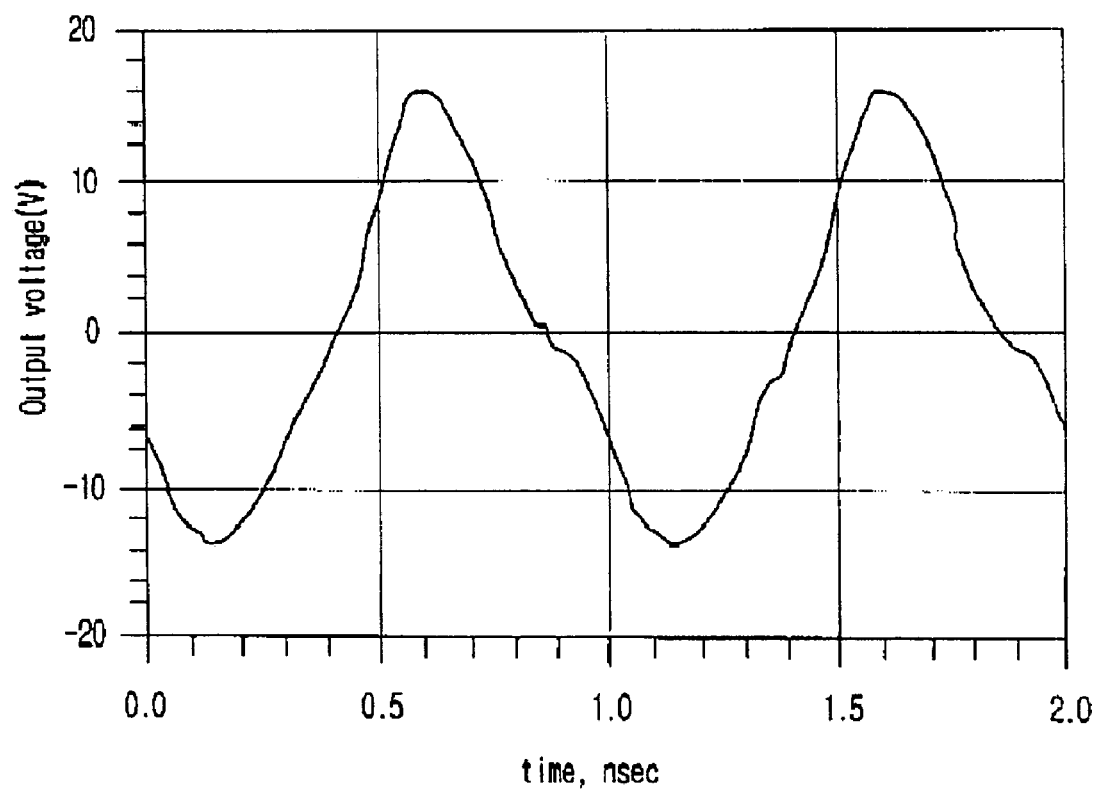

FIG. 15C is a graph illustrating voltages and currents according to time. FIG. 15D is a graph illustrating gate voltages according to time, and FIG. 15E is a graph illustrating output voltages according to time. According to the simulation results, the output power corresponds to 3.486 W, and a drain efficiency corresponds to 60.108%.

Figure 16A:
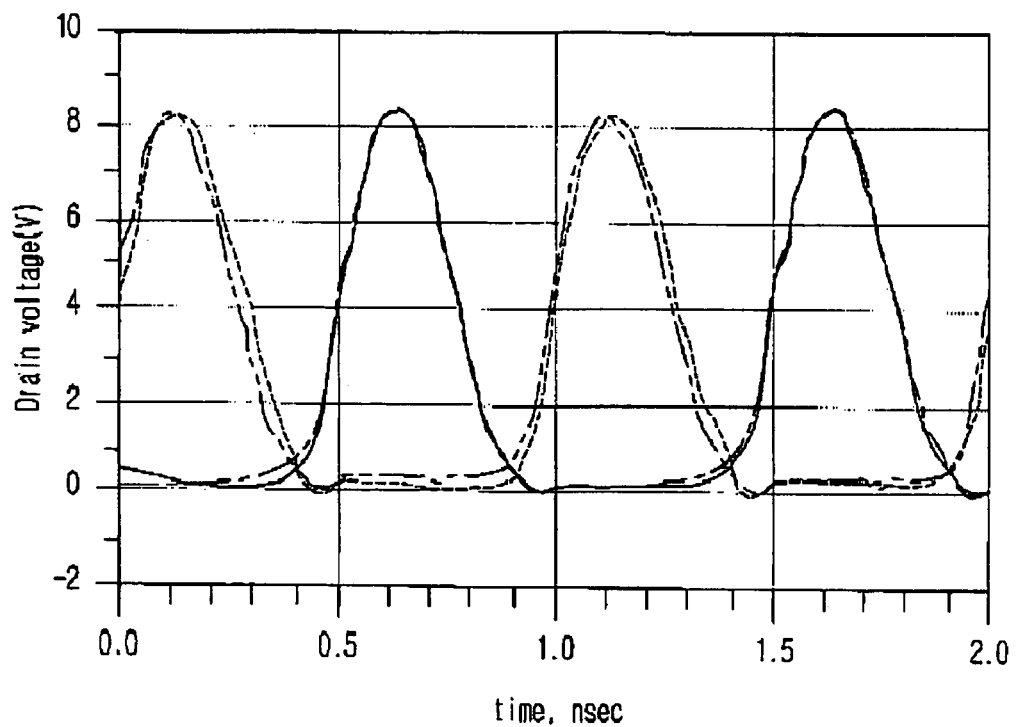
FIGS. 16A to 16E are graphs illustrating examples of simulation results when equalization capacitances are employed for the CMOS power amplifier according to the present invention.
Figure 16B:
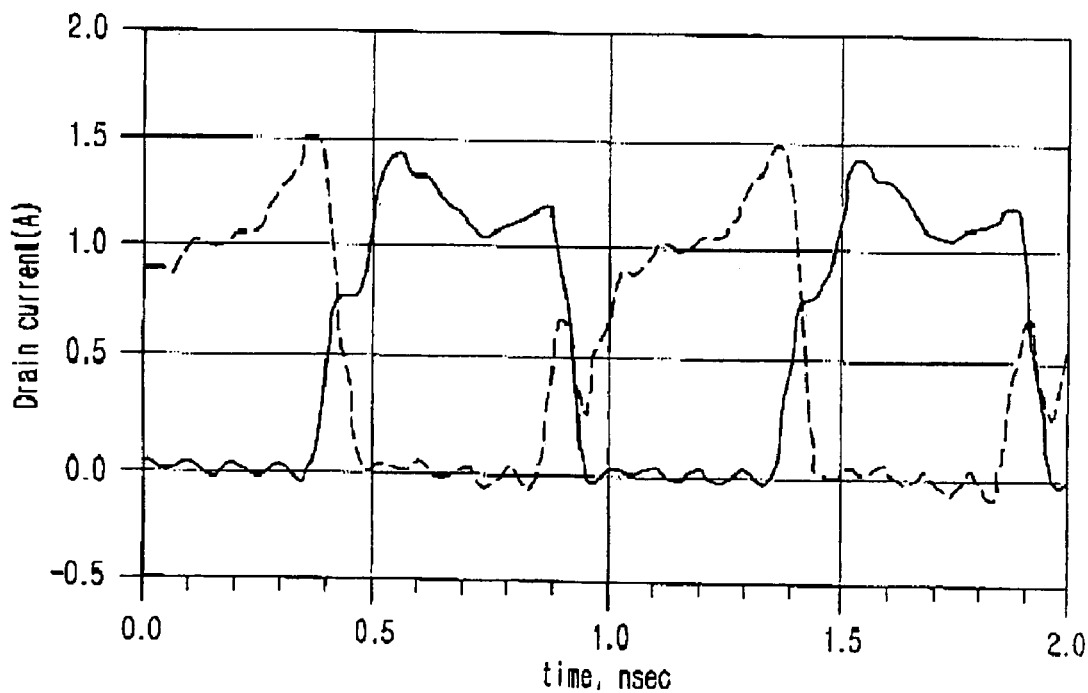
Figure 16C:
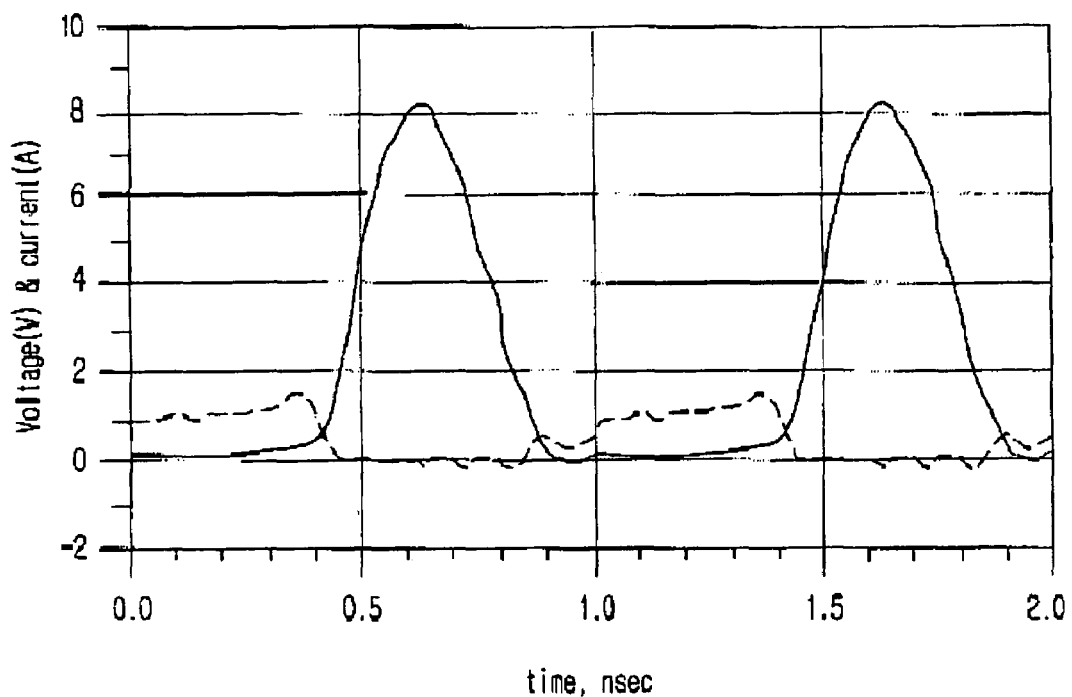

FIGS. 16A to 16C are graphs illustrating examples of simulation results when equalization capacitances are employed for the CMOS power amplifier according to the present invention.

More specifically, FIG. 16A is a graph illustrating drain voltages according to time as an example. Voltages at the P1, the P2, the P3, and the P4 must have opposite phases and the same level. The simulation result of FIG. 16A shows that the voltages maintain the above condition because the influence of parasitic capacitances is removed.

FIG. 16B is a graph illustrating drain currents according to time. Currents at the P1, the P2, the P3, and the P4 have the symmetrical structure of opposite phases and the same level.

Figure 16D:
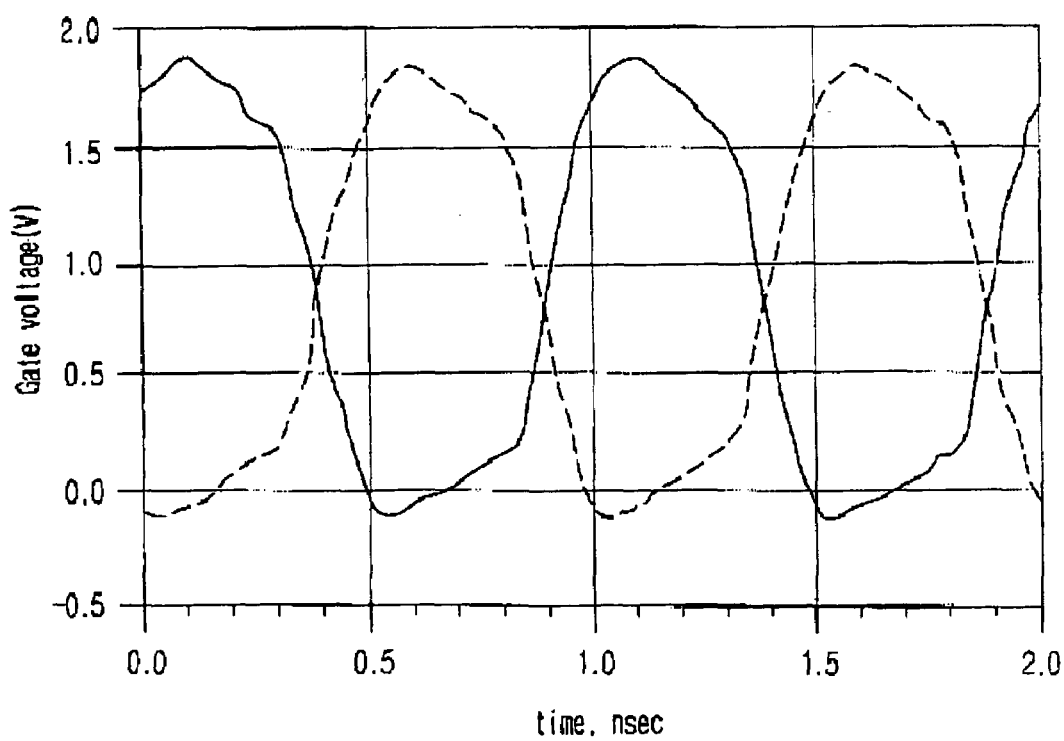
Figure 16E:
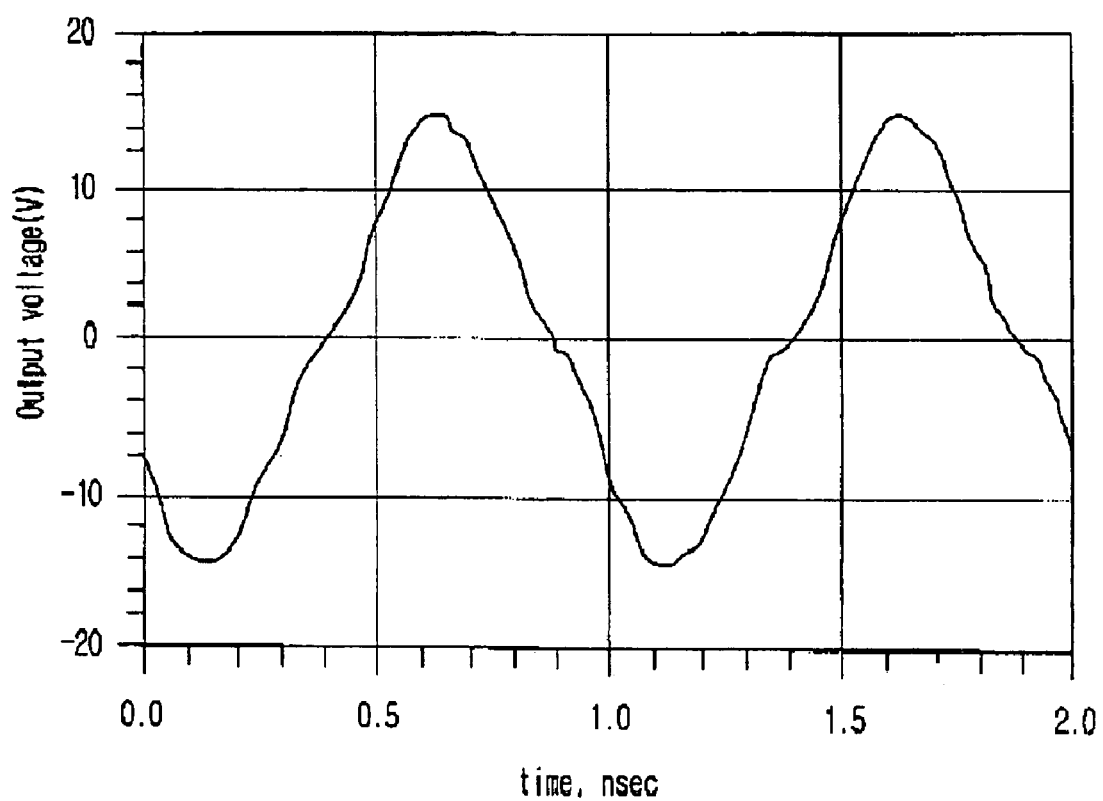

FIG. 16C is a graph illustrating voltages and currents according to time. FIG. 16D is a graph illustrating gate voltages according to time as an example, and FIG. 16E is a graph illustrating output voltages according to time. According to the simulation results, the output power corresponds to 3.552 W, and a drain efficiency corresponds to 62.322%.

As illustrated in FIGS. 15A to 16E, when the equalization capacitances are used, it is possible to improve the output and the efficiency of an amplifier.

As described above, according to the present invention, it is possible to construct a CMOS RF power amplifier at a low price and to realize an on-chip RF system having power and power efficiency that are superior to the conventional amplifiers.

Additionally, the present invention described above may be realized as program, which may be stored on storage media such as a CD ROM, a RAM, a floppy disc, a hard disc, and an optical magnetic disc in types, which can be read by a computer.

While the present invention has been shown and described with reference to certain preferred embodiments thereof, it will be understood by those skilled in the art that various changes in form and details may be made therein without departing from the spirit and scope of the present invention. Consequently, the scope of the invention should not be limited to the embodiments, but should be defined by the appended claims and equivalents thereof.

What is claimed is:

1. An on-chip complementary metal-oxide semiconductor (CMOS) power amplifier having an improved efficiency and a small fabrication size, the on-chip CMOS power amplifier comprising:
   a primary winding located at a first layer;
   secondary windings located at a second layer that is an upper part of the first layer, the secondary windings being located adjacent to a position of the primary winding; and
   a cross section for coupling the secondary windings with each other.

2. The on-chip CMOS power amplifier as claimed in claim 1, wherein the primary winding is divided by a predetermined number so that multi-turn is easily performed.

3. The on-chip CMOS power amplifier as claimed in claim 1, wherein the secondary windings are positioned at the second layer at a position adjacent to an outer upper portion of the primary winding so that parasitic capacitances between the primary winding and the secondary windings are removed.

4. The on-chip CMOS power amplifier as claimed in claim 1, wherein the primary winding and the secondary winding embody a push-pull power amplifier including a pair of N metal-oxide semiconductors (NMOSs).

5. The on-chip CMOS power amplifier as claimed in claim 1, further comprising two input amplifiers for providing an input signal having an opposite phase and an identical level with respect to the primary winding.

6. The on-chip CMOS power amplifier as claimed in claim 5, further comprising two input amplifiers for providing an input signal having an opposite phase and an identical level with respect to the secondary winding.

7. The on-chip CMOS power amplifier as claimed in claim 6, wherein the two input amplifiers have equalization capacitance sections for overcoming variation of input loads generated by parasitic capacitances between the primary winding and the secondary winding.

8. The on-chip CMOS power amplifier as claimed in claim 7, wherein the equalization capacitance section comprises a plurality of capacitors according to bands,
   wherein the capacitors are switched in order to employ multi-bands by controlling only a capacitor corresponding to a specific band to be activated.

9. The on-chip CMOS power amplifier as claimed in claim 6, wherein the input amplifier is a cascode amplifier.

10. The on-chip CMOS power amplifier as claimed in claim 5, wherein the two input amplifiers have equalization capacitance sections for overcoming variation of input loads viewed from the input amplifiers, the variation of input loads being generated by parasitic capacitances between the primary winding and the secondary winding.

11. The on-chip CMOS power amplifier as claimed in claim 10, wherein the equalization capacitance section comprises a plurality of capacitors according to bands,
   wherein the capacitors are switched in order to employ multi-bands by controlling only a capacitor corresponding to a specific band to be activated.

12. The on-chip CMOS power amplifier as claimed in claim 5, wherein the input amplifier is a cascode amplifier.

13. An on-chip complementary metal-oxide semiconductor (CMOS) power amplifier having an improved efficiency and being fabricated in a small size, the on-chip CMOS power amplifier comprising:
   four primary windings positioned at a first layer;
   secondary windings positioned at a second layer, which is an upper part of the first layer, the secondary windings being located corresponding to a position of the primary winding; and
   a cross section for connecting an external secondary winding to an interal secondary winding of the secondary windings.

14. The on-chip complementary metaloxide semiconductor (CMOS) power amplifier as claimed in claim 13, wherein the secondary windings are positioned at the second layer corresponding to an outer upper portion of the primary windings so that parasitic capacitances between the primary winding and the secondary windings are removed.

* * * * *